US012571095B2

(12) United States Patent
Shero et al.

(10) Patent No.: US 12,571,095 B2
(45) Date of Patent: Mar. 10, 2026

(54) LOW TEMPERATURE FLOWABLE VANADIUM OXIDE GAP FILL

(71) Applicant: ASM IP Holding B.V., Almere (NL)

(72) Inventors: Eric James Shero, Phoenix, AZ (US);
Charles Dezelah, Helsinki (FI);
Ren-Jie Chang, Leuven (BE); Qi Xie,
Wilsele (BE); Perttu Sippola, Tempe,
AZ (US); Petri Raisanen, Gilbert, AZ
(US)

(73) Assignee: ASM IP Holding B.V., Almere (NL)

( * ) Notice: Subject to any disclaimer, the term of this
patent is extended or adjusted under 35
U.S.C. 154(b) by 0 days.

(21) Appl. No.: 18/141,125

(22) Filed: Apr. 28, 2023

(65) Prior Publication Data

US 2023/0357924 A1      Nov. 9, 2023

Related U.S. Application Data

(60) Provisional application No. 63/364,060, filed on May
3, 2022.

(51) Int. Cl.
  *C23C 16/40*       (2006.01)
  *C23C 16/04*       (2006.01)
        (Continued)
(52) U.S. Cl.
  CPC .......... *C23C 16/405* (2013.01); *C23C 16/045*
        (2013.01); *C23C 16/4408* (2013.01);
        (Continued)
(58) Field of Classification Search
  CPC .................................................. C23C 16/405
  See application file for complete search history.

(56) References Cited

U.S. PATENT DOCUMENTS 4,300,149 A     11/1981  Howard
4,621,277 A     11/1986  Ito
        (Continued)

FOREIGN PATENT DOCUMENTS

CN      102127372 A     7/2011
CN      104517892 A     10/2017
        (Continued)

OTHER PUBLICATIONS

Blanquart et al., "Atomic layer deposition and characterization of
vanadium oxide thin films," 2013, RSC Advances 3, pp. 1179-1185.
(Year: 2013).*
        (Continued)

*Primary Examiner* — Robert A Vetere
(74) *Attorney, Agent, or Firm* — Snell & Wilmer L.L.P.

(57)         ABSTRACT
Vapor deposition methods and related systems are provided
for depositing layers comprising vanadium and oxygen. In
some embodiments, the methods comprise contacting a
substrate in a reaction space with alternating pulses of a
vapor-phase vanadium precursor and a vapor-phase oxygen
reactant. The reaction space may be purged, for example,
with an inert gas, between reactant pulses. The methods may
be used to fill a gap on a substrate surface. Reaction
conditions, including deposition temperature and reactant
pulse and purge times may be selected to achieve advanta-
geous gap fill properties. In some embodiments, the sub-
strate on which deposition takes place is maintained at a
relatively low temperature, for example between about 50°
C. and about 185° C.

19 Claims, 13 Drawing Sheets

(51) Int. Cl.
 *C23C 16/44*   (2006.01)
 *C23C 16/455*  (2006.01)
 *H01L 21/02*   (2006.01)
 *H01L 21/768*  (2006.01)

(52) U.S. Cl.
 CPC .. *C23C 16/45553* (2013.01); *H01L 21/02175*
   (2013.01); *H01L 21/02205* (2013.01); *H01L*
   *21/0228* (2013.01); *H01L 21/76831* (2013.01)

(56)     References Cited

U.S. PATENT DOCUMENTS

| | | |
|---|---|---|
| 6,319,766 B1 | 11/2001 | Bakli |
| 6,623,799 B1 | 9/2003 | Lee |
| 6,720,262 B2 | 4/2004 | Koh |
| 6,759,081 B2 | 7/2004 | Huganen |
| 7,622,369 B1 | 11/2009 | Lee |
| 7,651,959 B2 | 1/2010 | Fukazawa |
| 8,557,712 B1 | 10/2013 | Antonelli et al. |
| 8,835,332 B2 | 9/2014 | Kato et al. |
| 9,029,272 B1 | 5/2015 | Nakano |
| 9,425,078 B2 | 8/2016 | Tang et al. |
| 9,685,371 B2 | 6/2017 | Zope et al. |
| 9,812,320 B1 | 11/2017 | Pore |
| 9,887,082 B1 | 2/2018 | Pore |
| 10,094,035 B1 | 10/2018 | Graham |
| 10,177,025 B2 | 1/2019 | Pore |
| 10,388,513 B1 | 8/2019 | Blanquart |
| 10,395,919 B2 | 8/2019 | Masaru |
| 10,460,932 B2 | 10/2019 | Van Aerde |
| 10,510,590 B2 | 12/2019 | Thombare et al. |
| 10,580,645 B2 | 3/2020 | Ueda |
| 10,731,249 B2 | 8/2020 | Hatanpaa et al. |
| 11,145,506 B2 | 10/2021 | Maes et al. |
| 11,295,980 B2 | 4/2022 | Zope |
| 11,342,216 B2 | 5/2022 | Liu et al. |
| 11,447,864 B2 | 9/2022 | Fluit |
| 11,501,968 B2 | 11/2022 | Pierreux |
| 11,527,403 B2 | 12/2022 | Salmi |
| 12,112,942 B2 | 10/2024 | Ko |
| 2002/0060363 A1* | 5/2002 | Xi ..................... H01L 21/76877 |
| | | 438/653 |
| 2004/0224504 A1 | 11/2004 | Gadgil |
| 2005/0260357 A1 | 11/2005 | Olsen |
| 2008/0233742 A1 | 9/2008 | Kim et al. |
| 2009/0011145 A1* | 1/2009 | Yun ................... C23C 16/45542 |
| | | 427/255.28 |
| 2009/0317982 A1 | 12/2009 | Li et al. |
| 2012/0149213 A1 | 6/2012 | Nittala et al. |
| 2014/0106574 A1 | 4/2014 | Kang et al. |
| 2014/0124361 A1 | 5/2014 | Reid |
| 2015/0160149 A1 | 6/2015 | Bae |
| 2016/0307905 A1 | 10/2016 | Lansalot-Matras et al. |
| 2017/0040172 A1 | 2/2017 | Moon et al. |
| 2017/0140983 A1 | 5/2017 | Leschkies et al. |
| 2017/0309476 A1 | 10/2017 | Ventatasubramanian |
| 2017/0350012 A1 | 12/2017 | Moon |
| 2018/0033689 A1 | 2/2018 | Anthis et al. |
| 2018/0044790 A1 | 2/2018 | Cleemput |
| 2018/0082886 A1 | 3/2018 | Swaminathan et al. |
| 2018/0261502 A1 | 9/2018 | Tan |
| 2019/0055643 A1 | 2/2019 | Longrie et al. |
| 2019/0351595 A1 | 11/2019 | Moreels |
| 2019/0371662 A1 | 12/2019 | Chen |
| 2020/0052089 A1 | 2/2020 | Yu |
| 2020/0194304 A1 | 6/2020 | Roy |
| 2020/0365447 A1 | 11/2020 | Mays et al. |
| 2020/0373152 A1 | 11/2020 | Blanquart |
| 2020/0381275 A1 | 12/2020 | Brezoczky |
| 2021/0066080 A1* | 3/2021 | Mattinen ........... H01L 21/02568 |
| 2021/0125832 A1 | 4/2021 | Bhatnagar |
| 2021/0143003 A1 | 5/2021 | Fukuda |
| 2021/0249303 A1 | 8/2021 | Blanquart |
| 2021/0257213 A1 | 8/2021 | Yoshiyuki |
| 2021/0285102 A1 | 9/2021 | Yoon et al. |
| 2021/0313150 A1 | 10/2021 | Kang |
| 2021/0327714 A1 | 10/2021 | Lee |
| 2021/0332479 A1 | 10/2021 | Kim |
| 2022/0005693 A1 | 1/2022 | Mizoguchi |
| 2022/0051935 A1 | 2/2022 | Kim |
| 2022/0076996 A1 | 3/2022 | Blanquart |
| 2022/0081769 A1* | 3/2022 | Chaney ............. H01L 21/02178 |
| 2022/0102190 A1 | 3/2022 | Kang |
| 2022/0108915 A1 | 4/2022 | Liu |
| 2022/0119944 A1 | 4/2022 | Yoshimoto |
| 2022/0122841 A1 | 4/2022 | Blanquart |
| 2022/0165569 A1 | 5/2022 | Liu |
| 2022/0165615 A1 | 5/2022 | Liu |
| 2022/0223411 A1 | 7/2022 | Blanquart |
| 2022/0282374 A1 | 9/2022 | Alessio Verni |
| 2022/0285146 A1 | 9/2022 | Alessio Verni |
| 2022/0285211 A1 | 9/2022 | Farm |
| 2022/0293463 A1 | 9/2022 | Vervuurt |
| 2022/0301823 A1 | 9/2022 | Yoo |
| 2022/0319834 A1 | 10/2022 | Vervuurt |
| 2022/0319855 A1 | 10/2022 | Blanquart |
| 2022/0415650 A1 | 12/2022 | Ko |
| 2023/0030566 A1 | 2/2023 | Yoo |
| 2023/0069459 A1 | 3/2023 | Haukka |
| 2023/0095086 A1 | 3/2023 | Blanquart |
| 2023/0096453 A1 | 3/2023 | Lee |
| 2023/0096838 A1 | 3/2023 | Maes |
| 2023/0098575 A1 | 3/2023 | Dezelah |
| 2023/0110980 A1 | 4/2023 | La |
| 2023/0243031 A1 | 8/2023 | Fujita et al. |

FOREIGN PATENT DOCUMENTS

| | | |
|---|---|---|
| CN | 107665811 B | 1/2024 |
| JP | 2005187943 A | 7/2005 |
| JP | 2020029617 A | 2/2020 |
| KR | 20070023477 A | 2/2007 |
| TW | 202108815 A | 3/2021 |
| WO | 2019142055 A2 | 7/2019 |

OTHER PUBLICATIONS

Povey, et al., Atomic layer deposition for the fabrication of 3D photonic crystals structures: Growth of Al2O3 and VO2 photonic crystal systems, Surface & Coating Tech 201(2007) 9345-9348.

Ostreng, et al., Optical Properties of Vanadium Pentoxide Deposited by ALD, The Journal of Phys. Chem., 116 (2012) 19444-19450.

Lee et al., Growth without Postannealing of Monoclinic VO2 Thin Film by Atomic Layer Deposition Using VCI4 as Precursor, Coatings Nov. 27, 2018, 8(2018) 431, 1-11.

Blanquart et al., Atomic layer deposition and characterization of vanadium oxide thin films, RSC Advances 3 (2013) 1179-1185.

Galesic et al.; Formation of vanadium nitride by rapid thermal processing; Thin Solid Films 349 (1999): 14-18.

Choi et al.; Superfilling CVD of Copper Using A Catalytic Surfactant; IEEE; 2001; 3pp.

Merdrignac-Conanec et al.; Nitridation under ammonia of high surface area vanadium aerogels; Journal of Solid State Chemistry 178 (2005): 218-223.

Oyama et al.; Topotactic synthesis of vanadium nitride solid foams; Journal of materials research 8.6 (1993): 1450-1454.

Niskanen et al.; Radical-Enhanced Atomic Layer Deposition of Metallic Copper Thin Films; Journal of The Electrochemical Society, 152 (1) G25-G28 (2005).

Transition metal. Referenced from Encyclopedia Britannica (Year: 1998); https://www.britannica.com/science/transition-metal; 11 pp.

Group VIA-Chaicogens. Referenced from ChemPrime LibreTexts; https://chem.libretexts.org.@go/page/49509 (year: 2025); 2pp.

Halogen, References from Encyclopedia Britannica (Year: 1998); https://www.britannica.com/science/halogen; 10pp.

Barron, A., "8.1: The Group 15 Elements - The Pnictogens"; LibreTexts; 7pp .; https://chem.libretexts. org.

Encyclopedia Britannica; "Silane," Aug. 17, 2012; 2pp., https://www.britannica.com/science/transition-m et al.

(56) References Cited

OTHER PUBLICATIONS

Moore, J., "2.5: Group IVA"; LibraTexts, 3pp., https://chem. libretexts. org; 3pp.

* cited by examiner

LOW TEMPERATURE FLOWABLE VANADIUM OXIDE GAP FILL

CROSS-REFERENCE TO RELATED APPLICATIONS

This application is a nonprovisional of, and claims priority to and the benefit of, U.S. Provisional Patent Application No. 63/364,060, filed May 3, 2022 and entitled "LOW TEMPERATURE FLOWABLE VANADIUM OXIDE GAP FILL," which is hereby incorporated by reference herein.

FIELD

The present disclosure generally relates to the field of semiconductor processing methods and systems, and to the field of integrated circuit manufacture. In particular, methods and systems suitable for forming layers comprising vanadium oxide are disclosed.

BACKGROUND

The scaling of semiconductor devices, such as, complementary metal-oxide-semiconductor (CMOS) devices, has led to significant improvements in speed and density of integrated circuits. However, conventional device scaling techniques face significant challenges for future technology nodes. In particular, with miniaturization of wiring pitch of large scale integration devices, void-free filling of high aspect ratio gaps or trenches (e.g. trenches having an aspect ratio of three or higher) becomes increasingly challenging due to limitations of existing deposition processes. Therefore, there is a need for processes that efficiently fill high aspect ratio features, e.g., gaps such as trenches on semiconductor substrates, for example in the context of logic and/or memory devices. There is a particular need for processes that efficiently fills high aspect ratio features with vanadium oxide-containing materials.

Material deposition processes exhibiting liquid-like growth are a potential solution to achieve seam-free, uniform gap fill, which is not possible for traditional thin film growth methods. However, where flowability is limited due to crystallization and hardening effects in cavities, these effects leave seams upon film closure. On the other hand, material that is too flowable can lead to uneven layers and poor conformality. Therefore, there exists a need to deposit materials with flowable deposition techniques while also maintaining conformality on the substrate structures.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

In some aspects, methods and compositions are provided for depositing vanadium oxide on a substrate in a reaction space. In some embodiments the methods may be used for filling a gap, recess or other three-dimensional structure on a substrate. In some embodiments the substrate is contacted with a vapor-phase vanadium precursor and a vapor-phase oxygen reactant in a plurality of vapor deposition cycles.

In some embodiments a vapor deposition process forms vanadium oxide on a substrate in a reaction space. A substrate may be provided on a susceptor or other substrate support in the reaction space. Vanadium oxide is deposited on the substrate by a plurality of deposition cycles. In some embodiments, each deposition cycle comprises contacting the substrate with a pulse of a vapor-phase vanadium precursor and contacting the substrate with a pulse of a vapor-phase oxygen reactant. In some embodiments, the pulse of vapor-phase vanadium precursor forms a layer of vanadium species on the substrate surface. The subsequent pulse of vapor-phase oxygen reactant reacts with the vanadium species on the substrate surface to form vanadium oxide.

In some embodiments, excess vanadium precursor is purged from the reaction space after contacting the substrate with the vanadium precursor and prior to contacting the substrate with the oxygen reactant. In the vanadium precursor purge, excess vanadium precursor is removed from the vicinity of the substrate along with reaction byproducts, if any, such as by flowing a purge gas and/or by exhausting the excess vanadium precursor from the reaction chamber. In some embodiments, a duration of the vanadium precursor purge is from about 0.1 to about 10 seconds.

In some embodiments, the susceptor is maintained at a temperature of between about 50° C. and about 185° C. during the plurality of vapor deposition cycles. In some embodiments, the susceptor is maintained at a temperature of about 115° C. during the plurality of vapor deposition cycles.

In some embodiments, excess vapor-phase oxygen reactant is purged from the reaction space after contacting the substrate with the vapor-phase oxygen reactant and prior to commencing another deposition cycle. In some embodiments, the oxygen reactant is purged for a duration of about 0.1 to about 5 seconds. In some embodiments, the oxygen reactant purge comprises removing excess vapor-phase oxygen reactant and reaction byproducts, if any, from the vicinity of the substrate, such as by flowing a purge gas and/or by exhausting the oxygen reactant from the reaction chamber.

In some embodiments, the vanadium oxide is formed by an atomic layer deposition process. In some embodiments, the atomic layer deposition process comprises a plurality of deposition cycles in which the substrate is alternately and sequentially contacted with the vapor-phase vanadium precursor and the vapor-phase oxygen reactant.

In some embodiments, the oxygen reactant comprises one or more of molecular oxygen ($O_2$), water ($H_2O$), and hydrogen peroxide ($H_2O_2$).

In some embodiments, the vanadium precursor comprises one or more of a vanadium halide, a vanadium oxyhalide, a vanadium beta-diketonate compound, a vanadium cyclopentadienyl compound, a vanadium alkoxide compound, and a vanadium dialkylamido compound.

In some embodiments, the vapor-phase vanadium precursor is $VCl_4$ and the oxygen reactant is $H_2O$.

In some embodiments, a gap on a substrate is filled with vanadium oxide. In some embodiments, the gap on the substrate has an aspect ratio of about 2 to about 10.

In some aspects, the techniques described herein relate to methods of filling a gap on a substrate in a reaction space with vanadium oxide. The gap may, for example, have an aspect ratio between about 2 and 10. In some embodiments, the methods comprise a plurality of vapor deposition cycles comprising alternately and sequentially contacting the substrate with a vapor-phase vanadium precursor and a vapor-phase oxygen reactant.

In some embodiments, the substrate is supported in the reaction space by a susceptor. In some embodiments, a temperature of the susceptor is from about 50 to about 185° C., for example about 115° C., during the plurality of deposition cycles.

In some embodiments, alternately and sequentially contacting the substrate with the vapor-phase vanadium precursor and the oxygen reactant comprise, in order, pulsing a vapor-phase vanadium precursor into the reaction space to contact the substrate; purging excess vapor-phase vanadium precursor from the reaction space; pulsing a vapor-phase oxygen reactant into the reaction space; and removing excess vapor-phase oxygen reactant from the reaction space. In some embodiments, the vapor-phase oxygen reactant is purged from the reaction space for a duration of about 1 s to about 5 s. In some embodiments, the vanadium precursor is $VCl_4$ and the oxygen reactant is $H_2O$.

In some aspects, methods of forming gap fill layers are provided. In some embodiments, the gap fill layers may be formed on a substrate comprising at least one opening, for example a recessed pattern with an aspect ratio of between 2 and 10. In some embodiments, the substrate is supported on a susceptor having a temperature maintained between about 50° C. and about 185° C.

Surfaces of the opening are lined with a layer comprising vanadium oxide by a thermal cyclic vapor deposition process comprising exposing the substrate to a plurality of vapor deposition cycles, wherein the vapor deposition cycles comprise alternately and sequentially exposing the substrate to a vanadium precursor and an oxygen reactant. In some embodiments the vapor deposition cycles comprise an oxygen reactant purge in which excess oxygen reactant is removed from the vicinity of the substrate. In some embodiments the oxygen reactant purge is from about 0.1 to about 5 seconds.

DETAILED DESCRIPTION

Figure 1:
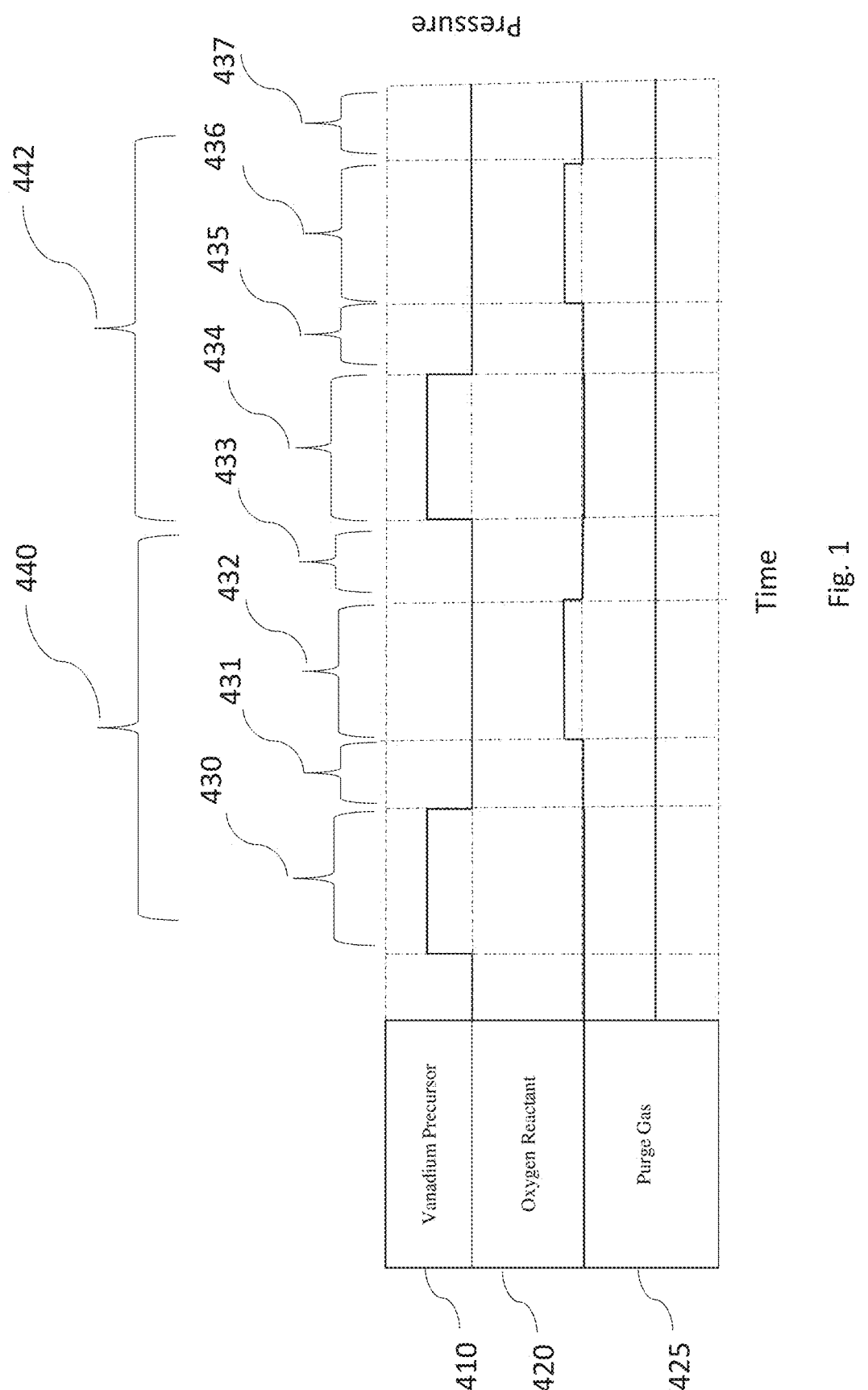
FIG. 1 illustrates an exemplary pulse/purge scheme.

Vanadium oxide may be deposited on a substrate in a reaction space by vapor deposition, such as by atomic layer deposition (ALD). In some embodiments, vanadium oxide is used to fill a gap or other three-dimensional structure on a substrate. The vapor deposition process may comprise a plurality of deposition cycles in which the substrate surface is separately contacted with a vapor-phase vanadium precursor and a vapor-phase oxygen reactant. In some embodiments, the vapor-phase vanadium precursor and the vapor-phase oxygen reactant are provided in separated pulses to a reaction space comprising a substrate on which deposition is desired. In some embodiments, excess vanadium precursor and excess oxygen reactant are removed from the substrate surface, for example, by purging with an inert gas for a predetermined period of time.

In some embodiments, a substrate on which vanadium oxide deposition is desired is provided in a reaction space. The substrate may be supported in the reaction space by a substrate support, such as a susceptor. A plurality of vapor deposition cycles are carried out to deposit vanadium oxide on the substrate. In some embodiments, each of the plurality of vapor deposition cycles comprises sequentially contacting the substrate with a vapor-phase vanadium precursor and a vapor-phase oxygen reactant. In some embodiments, the substrate is contacted with the vanadium precursor to form a layer of vanadium species on the substrate surface. The oxygen reactant may subsequently react with the vanadium species on the substrate surface to form vanadium oxide. In some embodiments the reaction space is purged to remove excess vapor-phase vanadium reactant and reaction byproducts, if any, after contacting the substrate with the vanadium precursor and prior to contacting the substrate with the oxygen reactant. In some embodiments the reaction space is purged to remove excess oxygen reactant and reaction byproducts, if any, after contacting the substrate with the oxygen reactant and prior to commencing another deposition cycle.

In some embodiments the deposition cycle comprises alternately and sequentially contacting the substrate with a vapor-phase vanadium precursor and a vapor-phase oxygen precursor. Pulses of the vapor-phase vanadium precursor and vapor-phase oxygen precursor may be separated by purge steps in which excess reactant is removed from the reaction space, for example with the aid of a purge gas.

In some embodiments the deposition cycles together make up an atomic layer deposition process. In some embodiments the deposition cycles together make up a cyclic chemical vapor deposition process.

As described in more detail below, in some embodiments the parameters of the deposition process, such as the temperature of the substrate and the purge times, may be selected to achieve desirable film characteristics, such as improved gap fill properties. As discussed further below, in some embodiments, gap fill properties of the vanadium oxide film are improved by using a relatively low susceptor temperature and corresponding substrate temperature. In some embodiments, gap fill properties of the vanadium oxide film are improved by using a relatively short oxygen reactant purge time in combination with a low susceptor temperature and corresponding substrate temperature. A shorter oxygen reactant purge time reduces the total process time by reducing cycle times. This reduction in process time also may reduce the thermal loading of deposited materials, which might otherwise cause density gradients within the materials and cause conformal growth. The use of low susceptor temperature, and corresponding low substrate temperature, may suppress crystallization and densification of the deposited material as well. Low susceptor temperature may promote condensation of a liquid phase material through selective condensation to confined nanostructures. The combination of a short oxygen reactant purge and low susceptor pressure may also encourage bottom-up gap fill and reduce or eliminate the formation of voids and seams within the filled gap.

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates comprise semiconductor materials, including, for example, silicon, silicon germanium, silicon oxide, gallium arsenide, gallium nitride and silicon carbide. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Further, the substrate can include various features, such as gaps, recesses, protrusions, and the like formed within or on at least a portion of a layer of the substrate. By way of example, a substrate can include bulk semiconductor material and an insulating or dielectric material layer overlying at least a portion of the bulk semiconductor material.

As used herein, the term "film" and/or "layer" can refer to any continuous or noncontinuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate and/or may be or may become embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices. A film or layer may be selectively grown on some parts of a substrate, and not on others.

As used herein, a "structure" can be or can include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes."

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced into a reaction chamber and is chemisorbed onto a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The terms "oxygen reactant" and "oxygen precursor" can refer to a gas or a material that can become gaseous and that can be represented by a chemical formula that includes oxygen. In some cases, the chemical formula includes oxygen and hydrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" indicates that certain features are included, but that it does not exclude the presence of other features, as long as they do not render the claim or embodiment unworkable. In some embodiments, the term "comprising" includes "consisting". As used herein, the term "consisting" indicates that no further features are present in the apparatus/method/product apart from the ones following said wording. When the term "consisting" is used referring to a chemical compound, it indicates that the chemical compound only contains the components which are listed.

In this disclosure, the term "filling capability" refers to a capability of filling a gap substantially without voids (e.g., no void having a size of approximately 5 nm or greater in diameter) and seams (e.g., no seam having a length of approximately 5 nm or greater), wherein seamless/void-less bottom-up growth of a layer is observed. The growth at a bottom of a gap may be at least approximately 1.5 times faster than growth on sidewalls of the gap and on a top surface having the gap. This disclosure concerns films having filling capability, i.e., films that preferentially grow bottom-up in a gap.

In this disclosure, a recess between adjacent protruding structures and any other recess pattern may be referred to as a "gap." That is, a gap, or opening, may refer to any recess pattern including a hole/via. A gap can have, in some embodiments, a width of about 3 nm, 4 nm, 5 nm, 6 nm, 7 nm, 8 nm, 9 nm, 10 nm, 12 nm, 14 nm, 16 nm, 18 nm, 20 nm, 22 nm, 24 nm, 26 nm, 28 nm, 30 nm, 40 nm, 50 nm, 60 nm, 70 nm, 80 nm, 90 nm, 100 nm, 120 nm, 140 nm, 160 nm, 180 nm, 200 nm, or any value or range of values therewithin, or about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, etc.

As used herein, the term "height" may refer to the extent of a gap in a plane perpendicular to the surface of the substrate that comprises the gap in question.

As used herein, the term "width" may refer to the extent of a gap in a direction in a plane parallel to the surface of the substrate that comprises the gap in question.

As used herein, the term "length" may refer to the extent of a gap in a direction in a plane parallel to the surface of the substrate that comprises the gap in question. The directions in which the "width" and the "length" are measured are mutually perpendicular. It shall be understood that all dimensions, including length, width, and height of a structure, can be measured using routine techniques such as scanning tunneling electron microscopy (STEM).

In this disclosure, any defined meanings do not necessarily exclude ordinary and customary meanings, in some embodiments.

Although described primarily in relation to filling a gap on a substrate, in some embodiments, vanadium oxide may be deposited by the methods described herein in other contexts. For example, in some embodiments, vanadium oxide may be deposited on substrates that do not comprise a gap. The methods for depositing vanadium oxide comprise introducing a substrate, on which deposition is desired, into a reaction space. In some embodiments, the substrate is provided with a gap. Exemplary gaps and openings include recesses, contact holes, vias, trenches, and the like. The gap comprises a distal part and a proximal part. The distal part comprises a distal surface. The proximal part comprises a proximal surface. It shall be understood that the gap does not necessarily have to be oriented vertically, but can extend in a horizontal direction. It shall be understood that the proximal part of the gap is the part of the gap that is closest to the substrate surface in which the gap forms a recess, and the distal part of the gap is the part of the gap that is most distant from that surface.

Vanadium oxide is deposited on the substrate in the reaction space by one or more deposition cycles. In some embodiments, the method comprises executing a plurality of deposition cycles. As mentioned above, deposition cycle comprises a vanadium precursor pulse and an oxygen reactant pulse. In some embodiments, the vanadium precursor pulse comprises contacting the substrate surface with a vanadium precursor, for example, by introducing a vanadium precursor into the reactor chamber. In some embodiments, the oxygen reactant pulse comprises contacting the substrate with an oxygen reactant, for example, by introducing an oxygen reactant into the reactor chamber. Thus, a vanadium oxide containing material is deposited on the substrate. In some embodiments, the vanadium oxide is preferentially deposited on the distal surface of the gap feature. The present methods are highly advantageous, e.g., when it is desirable to fill a gap or recess with vanadium oxide. In addition, vanadium oxide can be useful as a phase change material. Thus, it can be used, for example, in a phase change memory device. Furthermore, the presently disclosed methods can advantageously result in vanadium oxide layers containing little to no carbon impurities.

In some embodiments, a layer thus formed has a step coverage equal to or greater than 50%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 to about 25. It shall be understood that the term "step coverage" refers to the growth rate of a layer on a distal surface of a recess, divided by the growth rate of that layer on a proximal surface of the recess, and expressed as a percentage. In other words, it shall be understood that the vanadium oxide is preferentially deposited at the distal side/bottom of the gap feature. In other words, more metal oxide is deposited in a distal/lower/deeper portion of the gap feature compared to a proximal/upper portion of the gap feature. It shall be understood that a distal portion of the gap feature refers to a portion of the gap feature which is relatively far removed from a substrate's surface, and that the proximal portion of a gap feature refers to a part of the gap feature which is closer to the substrate's surface compared to the distal/lower/deeper portion of the gap feature.

It shall be understood that the presently disclosed methods are preferably thermal. In other words, no plasma is generated while the presently disclosed methods are executed.

As an example of a use case, a vanadium oxide gap fill layer formed in accordance with an embodiment of the present disclosure can be used as a dielectric filling layer above self-aligned contacts.

By means of a method as disclosed herein, a layer having a desired thickness can be deposited by repeating the deposition cycle multiple times. For example, and in some embodiments, the presently described methods can comprise depositing a layer having a thickness of about 0.1 nm to about 1 nm, about 1 nm to about 5 nm, about 5 nm to about 10 nm, about 10 nm to about 20 nm, about 20 nm to about 50 nm, or about 50 nm to about 100 nm. Thus, a method as described herein may comprise executing a suitable number of deposition cycles. In some embodiments, only one deposition cycle is executed. In some embodiments, the presently described methods comprise executing from about 2 to about 5 deposition cycles, about 5 to about 10 deposition cycles, about 10 to about 20 deposition cycles, about 20 to about 50 deposition cycles, about 50 to about 100 deposition cycles, about 100 to about 200 deposition cycles, about 200 to about 500 deposition cycles, about 500 to about 1000 deposition cycles, about 1000 to about 2000 deposition cycles, about 2000 to about 5000 deposition cycles, or about 5000 to 10000 or more deposition cycles.

Any suitable vanadium precursor can be used in the present methods. In some embodiments, the vanadium precursor is selected from a vanadium halide, a vanadium oxyhalide, and an organometallic vanadium compound. It shall be understood that the term "organometallic vanadium compound" refers to a vanadium-containing compound that comprises vanadium and carbon. For example, an "organometallic vanadium compound" may comprise a vanadium-carbon bond.

The vanadium precursor can, in some embodiments, comprise a vanadium halide. Suitable vanadium halides include vanadium chloride, vanadium fluoride, vanadium bromide, or vanadium iodide. In some embodiments, the vanadium precursor comprises vanadium chloride, such as vanadium(IV) chloride. In some embodiments the vanadium halide can include only vanadium and one or more halogens—e.g., vanadium tetrachloride or the like.

A vanadium oxyhalide can be selected, for example, from one or more of a vanadium oxyfluoride, a vanadium oxychloride, a vanadium oxybromide, and a vanadium oxyiodide. In some embodiments a vanadium oxyhalide can include only vanadium, oxygen, and one or more halides. By way of examples, a vanadium halide or oxyhalide can be selected from the group consisting of $VCl_4$, $VBr_4$, $VI_4$, $VOCl_4$, $VOBr_3$, $VOI_3$ (respectively named as vanadium tetrachloride, vanadium tetrabromide, vanadium tetraiodide, vanadiumoxytrichloride, vanadiumoxytribromide, and vanadiumoxytriiodide). For example, the vanadium precursor may comprise $VCl_4$.

Use of vanadium halide precursors can be advantageous in some embodiments relative to methods that use other precursors, such as metalorganic vanadium precursors, because the vanadium halide precursors can be relatively inexpensive, can result in vanadium layers with lower concentrations of impurities, such as carbon, and/or processes that use such precursors can be more controllable relative to processes that use metalorganic or other vanadium precursors. In addition, processes that use vanadium halides may be easier to scale up, compared to methods that use organometallic vanadium precursors. In some embodiments, the use of halide-free precursors can be advantageous, e.g. when it is desirable to minimize or avoid etching of exposed dielectric layers, e.g. high-k dielectric layers.

The vanadium precursor can, in some embodiments, comprises a vanadium beta-diketonate. Exemplary vanadium beta-diketonate compounds include $VO(acac)_2$, $VO(thd)_2$, $V(acac)_3$, $V(thd)_3$ (respectively named as oxobis (2,4-pentanedionato)vanadium(IV), oxobis(2,2,6,6-tetramethyl-3,5-hepanedionato)vanadium(IV), tris(2,4-pentanedionato)vanadium(IV), tris(2,2,6,6-tetramethyl-3,5-hepanedionato)vanadium(IV)), and the like.

In some embodiments, the vanadium precursor comprises one or more of a vanadium halide, a vanadium oxyhalide, and a vanadium organometallic compound. Thus, in some embodiments, the vanadium precursor comprises a vanadium halide. In some embodiments, the vanadium precursor comprises $VCl_4$. In some embodiments, the vanadium precursor comprises a vanadium oxyhalide. In some embodiments, the vanadium precursor comprises vanadium oxychloride. In some embodiments, the vanadium precursor comprises a vanadium alkoxide. In some embodiments, the vanadium precursor comprises vanadium(V) oxytriethoxide. In some embodiments, the vanadium precursor comprises vanadium(V) oxytripropoxide. In some embodiments, the vanadium precursor comprises a vanadium beta-diketonate. In some embodiments, the vanadium precursor comprises vanadium(III) acetyl acetonate.

The vanadium precursor can, in some embodiments, include one or more of a vanadium cyclopentadienyl compound, a vanadium alkoxide compound, a vanadium dialkylamido compound, a vanadium amidate compound, a vanadium alkylimido compound, or the like.

Exemplary vanadium dialkylamido compounds include $V(NMe_2)_4$, $V(NEt_2)_4$, and $V(NEtMe)_4$, (respectively named as tetrakis(dimethylamido)vanadium(IV), tetrakis(diethylamido)vanadium(IV), and tetrakis(ethylmethylamido)vanadium(IV)).

Exemplary vanadium alkoxide compounds include $V(OMe)_4$, $V(OEt)_4$, $V(OiPr)_4$, $V(OtBu)_4$, $VO(OMe)_3$, $VO(OEt)_3$, $VO(OiPr)_3$, and $VO(OtBu)_3$, (respectively named as tetrakis(methoxy)vanadium(IV), tetrakis(ethoxy) vanadium(IV), tetrakis(isopropoxy)vanadium(IV), tetrakis (t-butoxy)vanadium(IV), oxotris(methoxy)vanadium(IV), oxotris(ethoxy)vanadium(IV), oxotris(isopropoxy)vanadium(IV), and oxotris(t-butoxy)vanadium(IV)). Additional vanadium alkoxide compounds include variations of these compounds, where other alkoxy ligands are used.

Exemplary vanadium cyclopentadienyl compounds include $VCp_2Cl_2$, $VCp_2$, $VCp_2(CO)_4$, (respectively named as bischlorobis(cyclopentdienyl)vanadium(IV), bis(cyclopentadienyl)vanadium(II), and cyclopentadienylvanadium tetracarbonyl)). Additional exemplary vanadium cyclopentadienyl compounds include variations of these compounds, where Cp is either unsubstituted or bearing one or more alkyl groups, e.g., MeCp, EtCp, iPrCp, and the like.

Exemplary vanadium amidate compounds include: (N-(tert-butyl)(tert-butyl)amidate)tris(ethylmethylamido)vanadium, bis(N-(tert-butyl)isopropylamidate)bis(diethylamido) vanadium, (N-(tert-butyl)(tert-butyl)amidate)tris (ethylmethylamido)vanadium; tris(N-tert-butylacetamidate) (ethylcyclopentadienyl)vanadium Additional vanadium amidate compounds include variations of these compounds where other amidate ligands are used.

Exemplary vanadium alkylimido compounds include: tetrakis[ethylmethylamino]vanadium (TEMAV), V(Et-C≡C-Et)(NMe$_2$)(=NtBu), V(Me-C≡C-Me)(NMe$_2$)(=NtBu), V(MeCp)(NEtMe)$_4$, V(EtCp)(NEtMe)$_4$, V(iPrCp)(NEtMe)$_4$, V(tBuCp)(NEtMe)$_4$, V(Me$_2$ Cp)(NEtMe)$_4$. Additional vanadium alkylimido compounds include variations of these compounds where other amidate ligands are used.

The vanadium in the vanadium precursor can have any suitable oxidation state. For example, and in some embodiments, the vanadium comprised in the vanadium precursor can have an oxidation state of II, III, IV; or a mixture thereof. In some embodiments, the vanadium precursor comprises one or more compounds selected from vanadium (II) chloride, vanadium (III) chloride, vanadium (IV) chloride; and a mixture thereof.

Suitable oxygen reactants include an oxygen-containing compound or gas mixture. For example, the oxygen reactant can, in some embodiments, comprise a gas or vapor selected from O$_2$, H$_2$O, and H$_2$O$_2$. In some embodiments, the oxygen reactant comprises an oxygen and hydrogen-containing compound. In some embodiments, the oxygen reactant comprises H$_2$O.

In some embodiments, the vanadium precursor is provided to the reaction chamber in a pulse having a duration of about 0.01 s to about 10.0 s. In some embodiments, the precursor pulse lasts from about 0.25 s to about 5.0 s, or from about 0.5 s to about 2.0 s, or from about 1.0 s to about 1.5 s. In some embodiments, the vanadium precursor pulse lasts about 0.05 to about 0.2 seconds, or about 0.1 seconds.

In some embodiments, the vanadium precursor is entrained by a carrier gas. In some embodiments, the carrier gas is provided at a flow rate of about 0.2 to about 2.0 slpm, or from about 0.3 to about 1.5 slpm, or from about 0.4 to about 1.0 slpm, or from about 0.5 to about 0.7 slpm. In some embodiments, N$_2$ is used as a carrier gas. In some embodiments, a noble gas is used as a carrier gas. Suitable noble gasses include He, Ne, Ar, and Xe.

In some embodiments, the vanadium precursor contacts the substrate for a duration of about 0.01 s to about 10.0 s. In some embodiments, the vanadium precursor contacts the substrate for about 0.25 s to about 5.0 s, or from about 0.5 s to about 2.0 s, or from about 1.0 s to about 1.5 s. In some embodiments, the vanadium precursor contacts the substrate for about 0.05 to about 0.2 seconds, or about 0.1 seconds.

In some embodiments, after contacting the substrate with the vanadium precursor and prior to contacting the substrate with the oxygen reactant, excess vanadium precursor and/or reaction byproducts, if any, may be removed from the chamber. In some embodiments, excess vanadium precursor is removed by purging, for example, by flowing an inert purge gas into the reaction chamber. Purging may be aided by the use of a vacuum pump to evacuate the reaction chamber. In some embodiments, the duration of the time of the vanadium precursor purge is from about 0.025 s to about 2.0 s, or from about 0.05 s to about 0.8 s, or from about 0.1 s to about 0.4 s, or from about 0.2 s to about 0.3 s. In some embodiments, the vanadium precursor purge has a duration of about 1 s to about 30 s, about 1 s to about 20 s, about 1 s to about 10 s, about 0.1 s to about 0.2 s, about 0.2 s to about 0.5 s, about 0.5 s to about 1 s, about 1 s to about 2 s, about 2 s to about 5 s, or about 5 s to about 10 s. In some embodiments, a vanadium precursor purge lasts about 5 s.

In some embodiments, the vapor-phase oxygen reactant is provided to the reaction chamber in a pulse that lasts from about 0.25 s to about 4.0 s, or from about 0.5 s to about 2.0 s, or from about 1.0 s to about 1.5 s. In some embodiments, the oxygen reactant pulse has a duration of about 0.1 s to about 1.0 s, or about 0.1 s to about 0.2 s, or about 0.2 s to about 0.5 s, or about 0.5 s to about 1 s, or about 1 s to about 2 s, or about 2 s to about 5 s, or about 5 s to about 10 s, or about 10 s to about 20 s, or about 20 s to about 50 s. In some embodiments, the oxygen reactant pulse is from about 0.1 to about 1 seconds, from about 0.1 to about 0.5 seconds, or about 0.3 seconds.

In some embodiments, the vapor-phase oxygen reactant contacts the substrate for about 0.25 s to about 4.0 s, or from about 0.5 s to about 2.0 s, or from about 1.0 s to about 1.5 s. In some embodiments, the oxygen reactant contacts the substrate for about 0.1 s to about 1.0 s, or about 0.1 s to about 0.2 s, or about 0.2 s to about 0.5 s, or about 0.5 s to about 1 s, or about 1 s to about 2 s, or about 2 s to about 5 s, or about 5 s to about 10 s, or about 10 s to about 20 s, or about 20 s to about 50 s. In some embodiments, the substrate is contacted with the oxygen reactant for about 0.1 to about 1 seconds, from about 0.1 to about 0.5 seconds, or about 0.3 seconds.

In some embodiments, after contacting the substrate with the oxygen reactant, the excess oxygen reactant and/or reaction byproducts, if any, may be removed from the chamber. In some embodiments, the excess oxygen reactant is removed by purging, for example, with an inert purge gas. Purging may be aided by the use of a vacuum pump to evacuate the reaction chamber.

In some embodiments, the duration of the oxygen reactant purge may be from about 1 s to about 50 s, about 2 s to about 40 s, about 3 s to about 30 s, about 1 s to about 30 s, about 1 s to about 20 s, about 1 s to about 10 s, or about 1 s to about 5 s.

In some embodiments, the duration of the time of the oxygen reactant purge is selected to be relatively short. As mentioned above, a shorter oxygen reactant purge time may provide improved throughput by reduce the total process time through reducing cycle times. In some embodiments, a relatively short oxygen purge time may provide improved film qualities. In some embodiments, the oxygen reactant purge time is selected to reduce the thermal loading of deposited materials, which might otherwise cause density gradients within the materials and cause non-conformal growth. In some embodiments, the oxygen purge time is from about 0.025 s to about 30 s, or from about 20 s to about 30 s, about 10 s to about 30 s, about 10 s to about 20 s, or from about 0.05 s to about 8 second, or from about 0.1 s to about 5 s, or from about 0.05 s to about 0.8 s, or from about 0.1 s to about 0.4 s, or from about 0.2 s to about 0.3 s. In some embodiments, the duration of the oxygen reactant purge is about 5 s.

An exemplary pulse/purge scheme is illustrated in FIG. 1, in which the substrate in the reaction space is alternately and sequentially contacted with a vanadium precursor and an oxygen reactant. Pulses of the vanadium precursor and oxygen reactant are separated by purge steps in which excess reactant and reactant byproducts are removed from the reaction space and/or the vicinity of the substrate, for example with the aid of an inert purge gas. In some embodiments the purge gas 425 can flow continuously, as illustrated, while in other embodiments the purge gas 425 may be provided only during the purge steps (not shown). In some embodiments, the purge gas 425 may serve as a carrier gas for one or both of the vanadium precursor and oxygen reactant.

As illustrated in FIG. 1, a pulse of a vapor-phase vanadium precursor 410 is first provided into the reaction chamber at step 430 and contacts the substrate such that vanadium species are adsorbed on the substrate surface. After sufficient time to allow the vanadium precursor to react with the available binding sites on the substrate surface, excess vanadium precursor and reaction byproducts, if any, may be purged from the reaction chamber at time period 411 by a flowing purge gas 425. At step 432, a pulse of a vapor-phase oxygen reactant 420 is provided into the chamber where it contacts the substrate surface and reacts with the adsorbed vanadium species on the substrate surface to form vanadium oxide. After sufficient time for the oxygen reactant to react with available vanadium species on the substrate surface, excess oxygen reactant and reactant byproducts, if any, may be removed from the vicinity of the substrate, by purging with an inert purge gas 425 at time period 433.

A first deposition cycle 440 may comprise first contacting the substrate with vanadium precursor 410 at step 430 and subsequently contacting the substrate with the oxygen reactant 420 at step 432. The pulses of vanadium precursor and oxygen reactant may be separated by a flowing purge gas at steps 431 and 433. A second deposition cycle 442 may be performed after first deposition cycle 440. The second deposition cycle 442 may comprise contacting the substrate with a second pulse 434 of vanadium precursor 410 and a second pulse 436 of oxygen reactant 420. Again, the pulses of vanadium precursor and oxygen reactant may be separated by a flowing purge gas, here at steps 435 and 437. Thus, cycles 440 and 442 may each comprise alternately and sequentially contacting the substrate with a vapor-phase vanadium precursor 410 and an oxygen reactant 420. Although only two deposition cycles 440 and 442 are shown, it should be understood that the number of deposition cycles can be greater than two and may be for example between 1 and 10,000 or any suitable number of cycles selected to achieve the desired amount of vanadium oxide deposition.

The reaction chamber is, in some embodiments, and while executing a method as described herein, maintained at a pressure of about 0.1 Torr to about 10 Torr. In some embodiments, the presently described methods are carried out at a pressure of less than 760 Torr or about 0.2 Torr to about 760 Torr, about 1 Torr to about 100 Torr, or about 1 Torr to about 10 Torr. In some embodiments, the vanadium oxide containing layer is deposited at a pressure of about 10.0 Torr, or at a pressure of about 5.0 Torr, or at a pressure of about 3.0 Torr, or at a pressure of about 2.0 Torr, or at a pressure of about 1.0 Torr, or at a pressure of about 0.1 Torr, or at a pressure of about 0.01 Torr, or at a pressure of about 0.001 Torr, or at a pressure of about $10^{-1}$ Torr, or at a pressure of about $10^{-5}$ Torr, or at a pressure of about 0.1 Torr to about 10 Torr, or at a pressure of about 0.2 Torr to about 5 Torr, or at a pressure of about 0.5 Torr to about 2.0 Torr.

The present methods are, in some embodiments, carried out at a substrate temperature of less than about 800° C., or from about 400° C. to about 500° C., or from about 300° C. to about 400° C., or from about 200° C. to about 300° C., or from about 200° C. to about 400° C., or about 250° C. to about 350° C.

In some embodiments, lower substrate temperatures are used and may advantageously provide improved gap fill characteristics, such as good flowability while achieving high step coverage, and reduced crystallization/hardening effects in cavities, leading to improved filing capability and reduced formation of voids and/or seams relative to higher temperature processes. In some embodiments, lower substrate temperatures may also advantageously provide increased flowability, such that trenches and other semiconductor features may be filled in a bottom-up fashion, as compared to conventional ALD processes. In some embodiments, bottom-up filling can lead to a formed layer having a parabolic surface. For example, in some embodiments, the substrate temperature is about 50 to about 185° C., or about 100° C. to about 150° C. In some embodiments, the substrate temperature is about 75° C., about 95° C., about 115° C., or about 130° C.

In some embodiments, the substrate sits on or is otherwise supported by a substrate support system or device. In some embodiments, the support system is a susceptor. In some embodiments, the temperature of the substrate support, such as a susceptor, may be controlled. In some embodiments, the substrate support can be heated to a desired temperature. In some embodiments, the substrate support is heated to a temperature of less than about 800° C., or from about 400° C. to about 500° C., or from about 300° C. to about 400° C., or from about 200° C. to about 300° C., or from about 200° C. to about 400° C., or about 250° C. to about 350° C.

As with the substrate temperature, in some embodiments, the substrate support is heated to a lower temperature and this may advantageously provide deposition of vanadium oxide with improved gap fill characteristics. In some embodiments, the substrate support is set to a temperature of about 50 to about 185° C., for example about 115° C. In some embodiments, the substrate is supported on a susceptor and the susceptor temperature may be from about 50 to about 185° C. In some embodiments, the susceptor temperature may be about 115° C. In some embodiments, the susceptor temperature may be below 115° C. and above about 50° C. In some embodiments, the use of these lower substrate support temperatures may provide deposition of vanadium oxide with improved gap fill characteristics, such as good flowability while achieving high step coverage, and reduced crystallization/hardening effects in cavities. The use of lower temperature substrate support may provide improved filing capability and reduced formation of voids and/or seams in gap structures relative to higher temperature processes.

In some embodiments, the vanadium content of a layer formed by means of a method as described herein is from about 1.0 atomic percent to about 99.0 atomic percent, or from about 3.0 atomic percent to about 97.0 atomic percent, or from about 5.0 atomic percent to about 95.0 atomic percent, or from about 10.0 atomic percent to about 90.0 atomic percent, or from about 20.0 atomic percent to about 80.0 atomic percent, or from about 30.0 atomic percent to about 70.0 atomic percent, or from about 40.0 atomic percent to about 60.0 atomic percent.

In some embodiments, the oxygen content of the layer formed by means of a method as described herein is from about 1.0 atomic percent to about 70.0 atomic percent, or from about 3.0 atomic percent to about 65.0 atomic percent, or from about 5.0 atomic percent to about 60.0 atomic percent, or from about 10.0 atomic percent to about 50.0 atomic percent, or from about 15.0 atomic percent to about 50.0 atomic percent, or from about 20.0 atomic percent to about 40.0 atomic percent, or from about 25.0 atomic percent to about 35.0 atomic percent.

After deposition of the materials of some of the embodiments, the vanadium oxide may be converted into another material. For example, the vanadium oxide may be converted to a nitride, metal and other material. In some embodiments, the conversion can be carried out, for example, by filling a gap with vanadium oxide and then converting the deposited oxide material to the desired material. In some embodiments, the conversion may be carried out after the vanadium nitride deposition is completed. In some embodiments, the conversion may be carried out by intermittently treating the vanadium oxide as it is being deposited. For example, vanadium oxide may be treated in one or more deposition cycles to convert it to the desired material, or at intervals after a certain number of deposition cycles throughout the deposition process.

A monocrystalline silicon wafer may be a suitable substrate. Other substrates may be suitable well, e.g., monocrystalline germanium wafers, gallium arsenide wafers, quartz, sapphire, glass, steel, aluminum, silicon-on-insulator substrates, plastics, etc.

Further provided is a semiconductor device comprising a layer which is formed by means of a method as described herein. In some embodiments, the semiconductor device can be or form part of, for example, a MOSFET, e.g. a pMOS-FET or an nMOSFET.

Further described herein is a wire partially or wholly lined with a layer comprising vanadium and oxygen. Advantageously, the layer comprising vanadium and oxygen is formed by means of a method as described herein. In some embodiments, the wire comprises copper. In some embodiments, the wire comprises tungsten. In some embodiments, the wire comprises a core that consists of, or that substantially consists of, copper and/or tungsten. In some embodiments, the wire comprises molybdenum. In some embodiments, the wire comprises ruthenium. In some embodiments, the wire comprises silver. In some embodiments, the wire comprises gold. In some embodiments, the wire comprises platinum. In some embodiments, the wire comprises palladium. Advantageously, the layer is formed according to a method for forming a layer on a on a substrate in a reaction chamber as described herein. It shall be understood that the term "wire" may refer to an interconnect or to a plurality of interconnects, which are commonly encountered in integrated circuits.

In some embodiments, a system is provided for carrying out the vanadium oxide deposition. In some embodiments, a system comprises a reaction chamber, a vanadium precursor gas source, an oxygen reactant gas source, and a controller. The precursor gas source comprises a vanadium precursor. The oxygen reactant gas source comprises an oxygen reactant. The oxygen reactant comprises oxygen. The controller is configured to control gas flow into the reaction chamber to form a layer overlying a surface of a substrate. The layer comprises vanadium and oxygen. It shall be understood that the layer is deposited by means of a method as described herein. In some embodiments, the controller is configured to control the temperature of a substrate support, such as a susceptor, in a range of about 50° C. to about 185° C., for example about 115° C.

In some embodiments, the system further comprises a showerhead injector. The showerhead injector is arranged for sequentially providing the vanadium precursor and the oxygen reactant to the reaction chamber. In some embodiments, the temperature of the showerhead injector is lower than the temperature of the substrate support. In some embodiments, the temperature of the showerhead injector is no more than 20° C. lower than the temperature of the substrate support.

Figure 2:
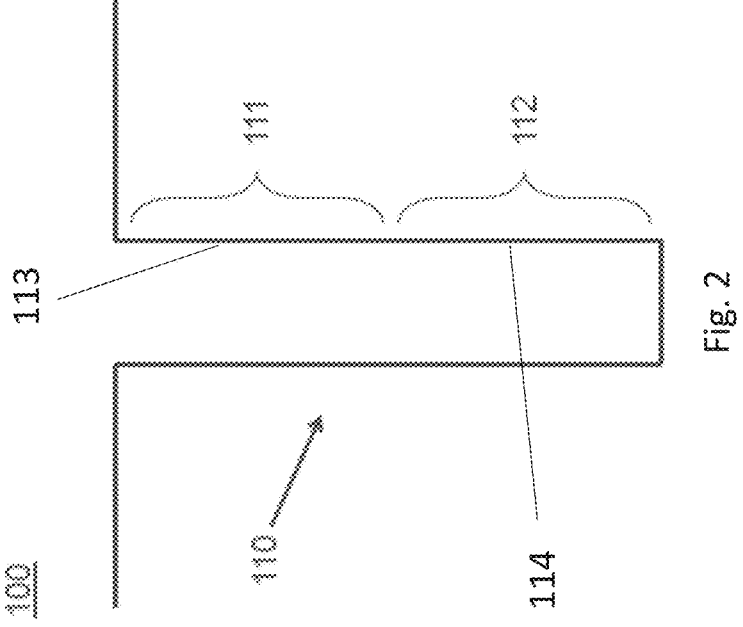
FIG. 2 illustrates a schematic representation of a substrate comprising a gap feature.

FIG. 2 shows a schematic representation of a substrate (100) comprising a gap feature (110). The gap feature (110) comprises a proximal part (111) and a distal part (112). The proximal part (111) comprises a proximal surface (113), and the distal part (112) comprises a distal surface (114). The present methods result in preferential growth of vanadium oxide on the distal surface compared to the proximal surface, thereby resulting in a bottom-up filling of the gap.

Figure 3:
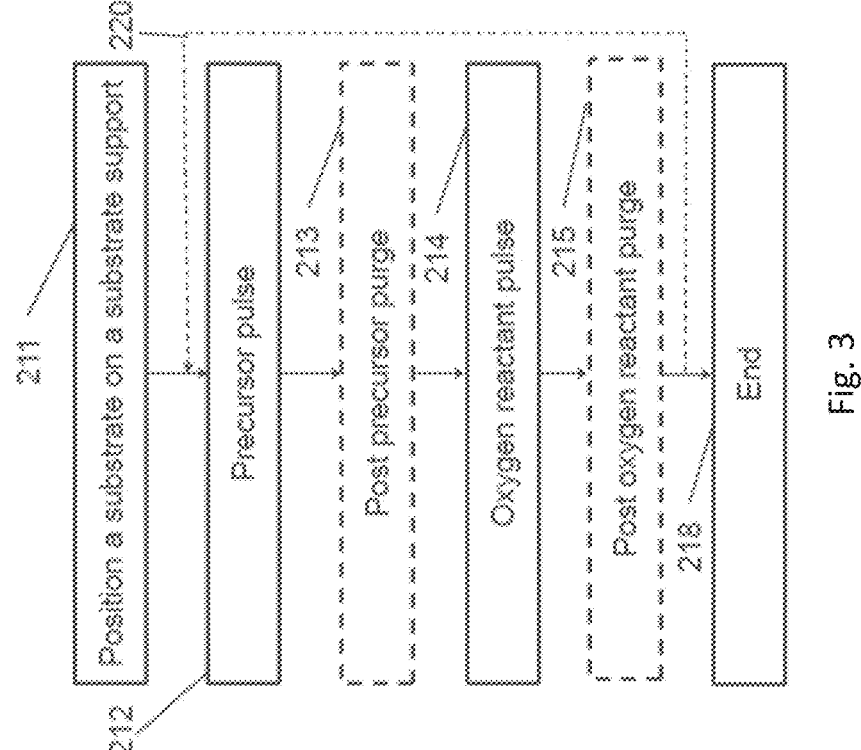
FIG. 3 illustrates a schematic representation of an embodiment of a method as described herein.

FIG. 3 shows a schematic representation of an embodiment of a method as described herein. The method can be used to fill a gap comprised in an integrated circuit. The method comprises a step (211) of positioning a substrate on a substrate support, which can be a susceptor. Then, the method comprises executing a precursor pulse (212) in which a vanadium precursor is provided to the reaction chamber. Optionally, the reaction chamber is purged after the precursor pulse (212) by means of a post precursor purge (213). Alternatively, the post precursor purge (213) can comprise transporting the substrate through a purge gas curtain. Then, the method comprises executing an oxygen reactant pulse (214) in which the substrate is exposed to an oxygen reactant. Optionally, the oxygen reactant pulse (214) can be followed by a post oxygen reactant purge (215) in which the reaction chamber can be purged by means of a purge gas. Alternatively, the post oxygen reactant purge (215) can comprise transporting the substrate through a purge gas curtain. The precursor pulse (212) and the oxygen reactant pulse (214) together form a deposition cycle. Optionally, the method comprises subsequently executing a plurality of deposition cycles, i.e. optionally the method comprises repeating (220) the precursor pulse (212) and the oxygen reactant pulse (214) one or more times. Thus, a vanadium oxide layer having a pre-determined thickness is deposited. After the vanadium oxide layer has achieved a desired thickness, the method ends (218).

A method according to FIG. 3 can include heating or cooling the substrate to a desired deposition temperature within the reaction chamber. In some embodiments, a method according to FIG. 3 includes heating the substrate to a desired temperature. In some embodiments, this is achieved by heating a susceptor or other substrate support to the desired temperature.

In some embodiments, a gap is filled while avoiding the formation of seams and voids. In an exemplary embodiment, a vanadium precursor, such as $VCl_4$, is contacted with a substrate in a reaction chamber by a precursor pulse having a pulse time of 0.1 s. Excess vanadium precursor and reaction by-products, if any, are removed from the reaction chamber by a precursor purge 213, with a purge time of 5 s. An oxygen reactant, such as $H_2O$, is contacted with the substrate in an oxygen reactant pulse 215 having a pulse time of 0.3 s. After reacting with vanadium species on the substrate surface to form vanadium oxide, excess oxygen reactant and reaction by-products, if any, are removed from the reaction chamber by an oxygen reactant purge 215, having a purge time of 5 s. The deposition cycle is repeated 220 until a vanadium oxide film of the desired thickness is formed. In some embodiments, the substrate in the reaction space is supported on a susceptor that is maintained at a temperature of about 115° C. during the deposition process. In some embodiments, the substrate comprises a gap and the deposition cycle is repeated until the gap is filled. In some embodiments, the gap is filled without leaving a seam. In some embodiments, the substrate comprises a reentrant structure.

Figure 4:
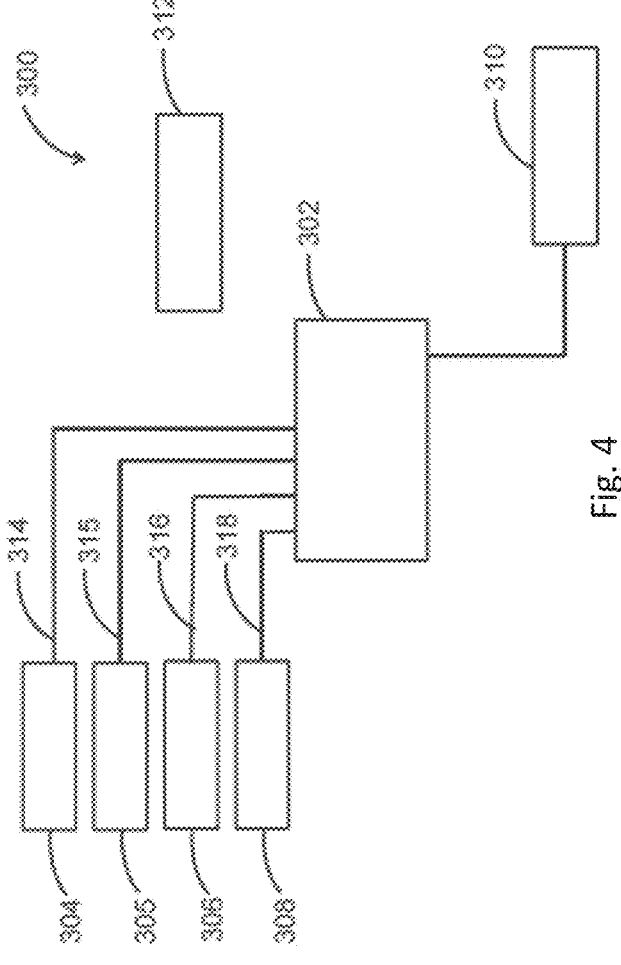
FIG. 4 illustrates a system suitable for conducting methods described herein.

FIG. 4 illustrates a system (300) in accordance with exemplary embodiments of the disclosure. The system (300) can be configured to perform a method as described herein and/or form a structure or device portion as described herein.

In the illustrated example, the system (300) includes one or more reaction chambers (302), a first precursor gas source (304), a second precursor gas source (305), a reactant gas source (306), a purge gas source (308), an exhaust (310), and a controller (312).

The reaction chamber (302) can include any suitable reaction chamber, such as an ALD or CVD reaction chamber.

The precursor gas sources (304 and 305) can include a vessel and one or more precursors as described herein—alone or mixed with one or more carrier (e.g., noble) gases. The reactant gas source (306) can include a vessel and one or more reactants as described herein—alone or mixed with one or more carrier gases. The purge gas source (308) can include one or more inert gases as described herein. In some embodiments, the one or more inert gasses are selected from nitrogen and a noble gas. Although illustrated with four gas sources (304)-(308), the system (300) can include any suitable number of gas sources. The gas sources (304)-(308) can be coupled to the reaction chamber (302) via the lines (314)-(318), which can each include flow controllers, valves, heaters, and the like. The exhaust (310) can include one or more vacuum pumps.

The controller (312) includes electronic circuitry and software to selectively operate valves, manifolds, heaters, pumps and other components included in the system (300). Such circuitry and components operate to introduce precursors, reactants, and purge gases from the respective sources (304)-(308). The controller (312) can control timing of gas pulse sequences, temperature of the substrate and/or reaction chamber, pressure within the reaction chamber, and various other operations to provide proper operation of the system (300). The controller (312) can include control software to electrically or pneumatically control valves to control flow of precursors, reactants and purge gases into and out of the reaction chamber (302). The controller (312) can include modules such as a software or hardware component, e.g., a FPGA or ASIC, which performs certain tasks. A module can advantageously be configured to reside on the addressable storage medium of the control system and be configured to execute one or more processes as described herein.

Other configurations of the system (300) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (302). Further, as a schematic representation of a system, many components have been omitted for simplicity of illustration, and such components may include, for example, various valves, manifolds, purifiers, heaters, containers, vents, and/or bypasses.

During operation of the system (300), substrates, such as semiconductor wafers (not illustrated), are transferred from, e.g., a substrate handling system to the reaction chamber (302). Once the substrate(s) are transferred to the reaction chamber (302), one or more gases from the gas sources (304)-(308), such as precursors, reactants, carrier gases, and/or purge gases, are introduced into the reaction chamber (302).

Figure 5:
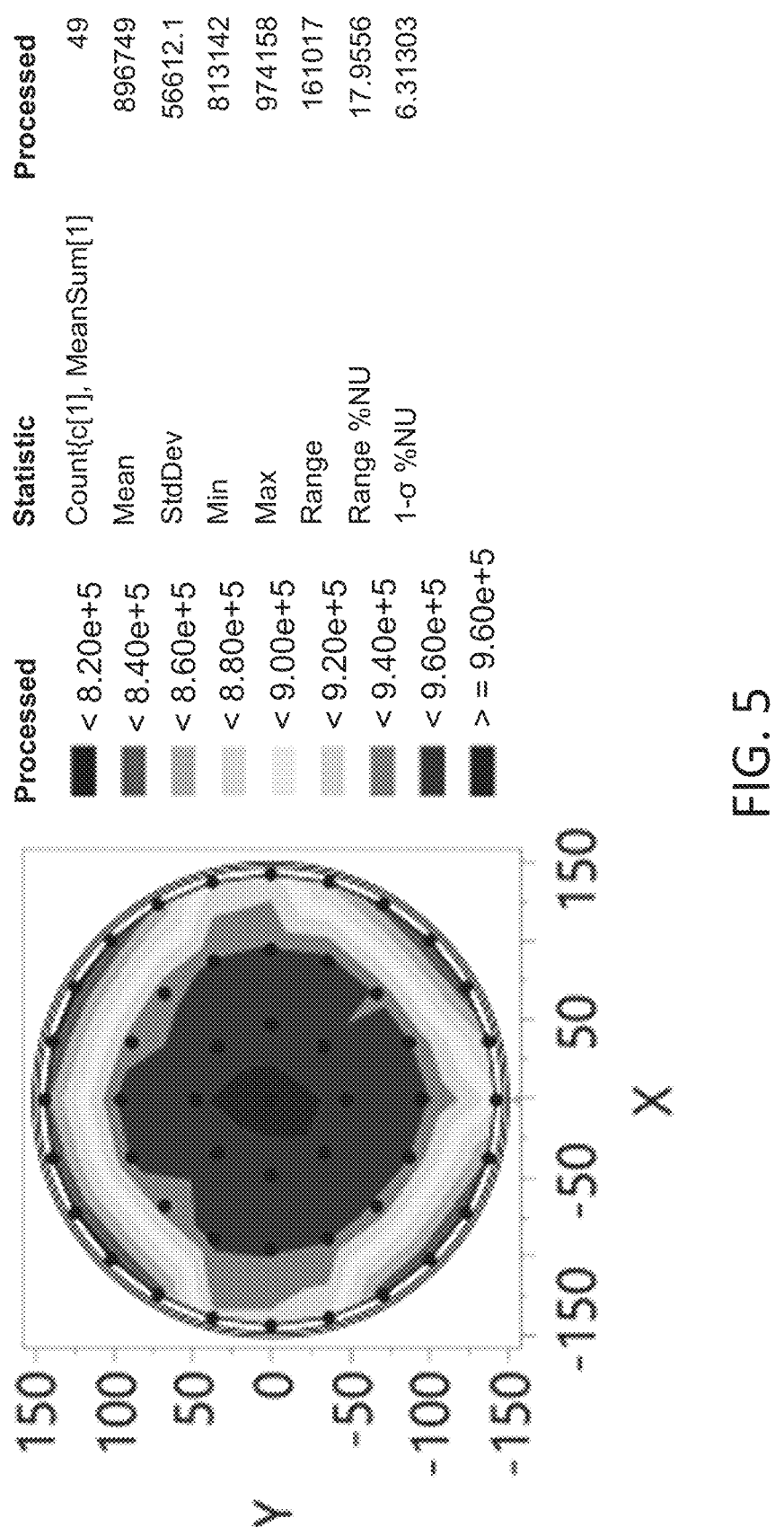
FIG. 5 illustrates experimental sheet resistance data.

FIG. 5 shows experimental sheet resistance data of a blanket vanadium oxide film deposited using a cyclical deposition process comprising alternating vanadium precursor pulses and oxygen reactant pulses separated by purges. The cyclical deposition process used to deposit the vanadium oxide film employs vanadium chloride, i.e. $VCl_4$, as a vanadium precursor and $H_2O$ as an oxygen reactant. The vanadium oxide film was deposited on a dielectric stack comprising a thermal silicon oxide layer covered with a hafnium oxide layer, thereby allowing to easily measure the sheet resistance of the vanadium oxide film. Excellent sheet resistivity uniformity was obtained. This layer was deposited using a vanadium precursor pulse that lasted 0.1 s, a post precursor purge that lasted 5 s, an oxygen reactant pulse that lasted 0.3 s, and an inter-cycle purge that lasted 20 seconds. The reaction chamber was maintained at a pressure of 1 Torr, and the substrate was maintained at a temperature of 300° C. The vanadium oxide film was deposited on a dielectric stack comprising thermal silicon oxide and hafnium oxide in order to improve sheet resistance measurements. A total of 350 cycles were executed, yielding a vanadium oxide film having a thickness of about 10 nm. The film's elemental composition was studied by means of xray photoelectron spectroscopy (XPS), and yielded 32.49 at % V, 64.42 at % 0, 0.13 at % Cl, 0.28 at % C, and 2.68 at % Si. Thus, the film advantageously contains a very low amount of carbon and chlorine impurities. Root means square (RMS) roughness measured by means of atomic force microscopy (AFM) was 0.43 nm.

Figure 6:
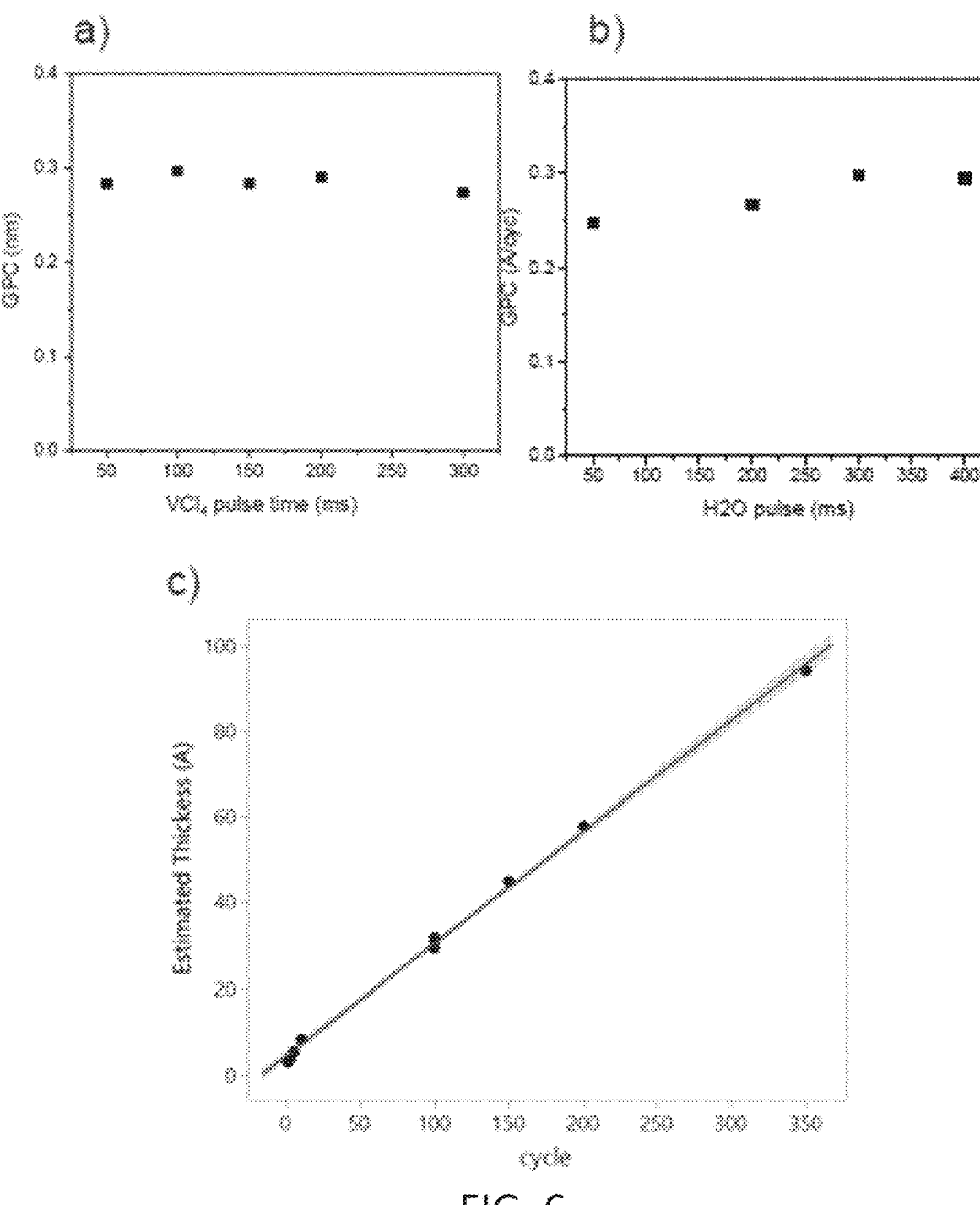
FIG. 6 shows experimental results of vanadium oxide deposition cycles performed according to certain embodiments described herein.

FIG. 6 shows experimental results of vanadium oxide deposition cycles performed using an embodiment of methods as described herein. The vanadium precursor used in the illustrated experiment was $VCl_4$, and the oxygen reactant was $H_2O$. Panel a) shows saturation experiments in which the vanadium oxide deposition was performed at 300° C. showing that the growth per cycle is constant irrespective of vanadium precursor pulse time, over a wide range. Panel b) shows saturation experiments performed at 300° C. showing that the growth per cycle is constant irrespective of oxygen reactant pulse time, over a wide range. Panel c) shows that the growth rate is linear from about 0 to about 350 cycles. The above-mentioned saturation and linearity experiments were performed using a $VCl_4$ pulse time of 0.1 seconds, an intra-deposition cycle purge time of 5 seconds, an oxygen reactant pulse time of 0.3 seconds, and an inter-deposition cycle purge time of 20 seconds. The process was carried out at a pressure of 1 Torr. Using such conditions, a vanadium oxide deposition process having ALD characteristics, i.e. a deposition featuring self-limiting surface reactions, can be obtained.

Figure 7:
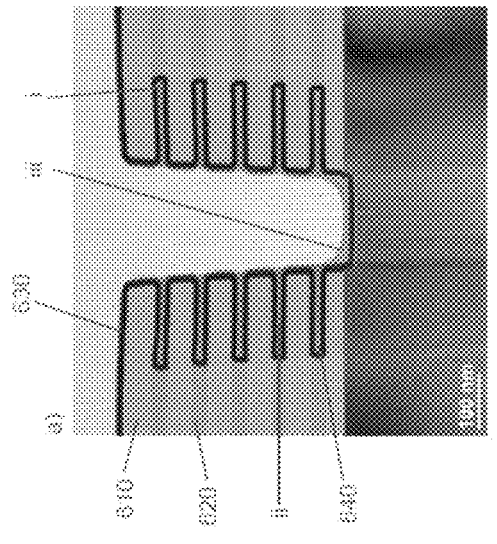
FIG. 7 is a transmission electron micrograph of a gap filled structure.
Figure 7:
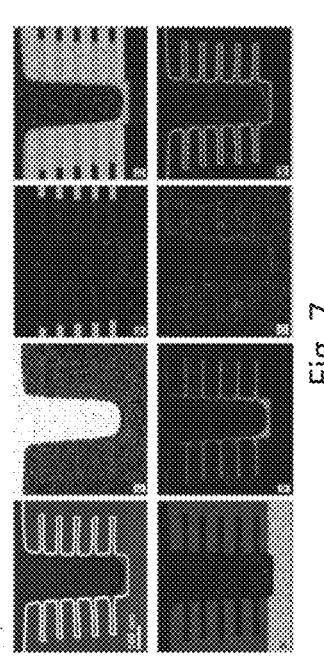

FIG. 7 shows a test structure comprising alternating silicon oxide layers (610) and silicon nitride layers (620). In particular, panel a) shows a transmission electron micrograph of the test structure, and panel b) shows elemental composition maps obtained by means of electron energy loss spectroscopy. The silicon nitride layers (620) are recessed to form horizontal gaps, i.e. cavities. A hafnium oxide layer (630) was conformally deposited on the test structure. Thus, hafnium oxide-lined cavities were formed. These cavities were filled with vanadium oxide layer (640) deposited in a CVD-like regime in accordance with an embodiment of a method as disclosed herein. In particular, hafnium oxide has a thickness of about 9 nm, and vanadium oxide was deposited with a number of cycles that was selected to obtain a 3 nm thick vanadium oxide layer on an unpatterned substrate. In this experiment, enhanced growth of vanadium oxide in the hafnium oxide-lined cavities was observed. Without the invention being bound to any particular theory or mode of operation, it is believed that residual hydrogen in the hafnium oxide-lined cavities during a precursor pulse results in CVD-type growth with an enhanced growth per cycle inside the hafnium-lined cavities, whereas outside the hafnium-lined cavities, the hydrogen is poorly retained, and an ALD-type growth occurs with a lower growth rate per cycle. Thus, a gap can be seamlessly filled bottom-up with vanadium oxide. At the top of the wafer (position i), only 3.6 nm vanadium oxide was deposited. At the bottom of the recess from which the lateral hafnium-lined cavities start (position iii), 11 nm of vanadium oxide was deposited. The hafnium lined cavities (location ii) are completely and seamlessly filled with vanadium oxide. Thus, it is clear that vanadium oxide is selectively deposited in gaps such recesses, trenches, cavities, and the like.

Figure 8:
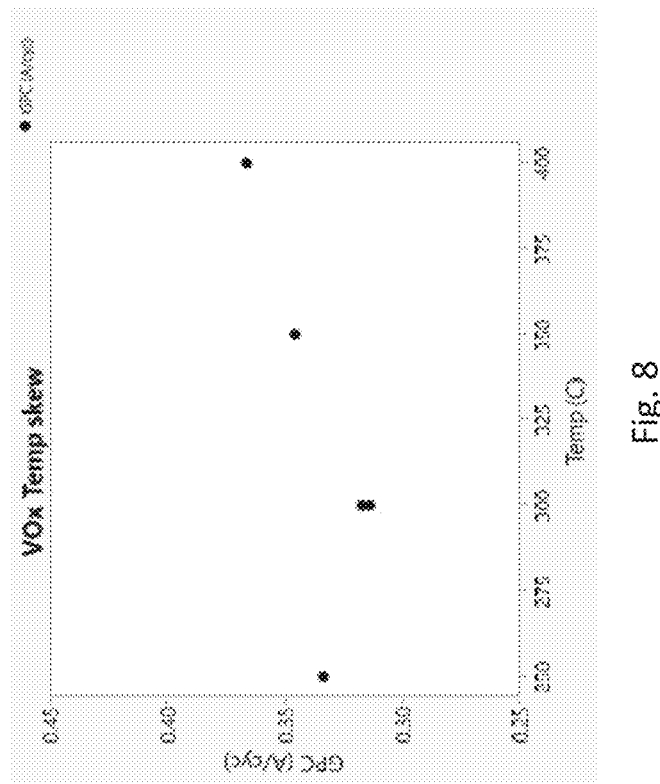
FIG. 8 shows growth per cycle (GPC) measurements as a function of substrate temperature during vanadium oxide deposition.

FIG. 8 shows growth per cycle (GPC) measurements as a function of substrate temperature during vanadium oxide deposition. $VCl_4$ was used as a vanadium precursor and $H_2O$ was used as an oxygen reactant. $VCl_4$ pulse time was 0.1 s, vanadium precursor purge time was 5 s; oxygen reactant pulse time was 0.3 s, and oxygen reactant purge time was 20 s. A total number of 100 deposition cycles were performed. Reactor pressure was 1 Torr. No significant growth rate per cycle (GPC) dependence on temp was observed, except for a slight increase of GPC at higher temperatures. No particle formation was observed for any of the conditions.

Figure 9A:
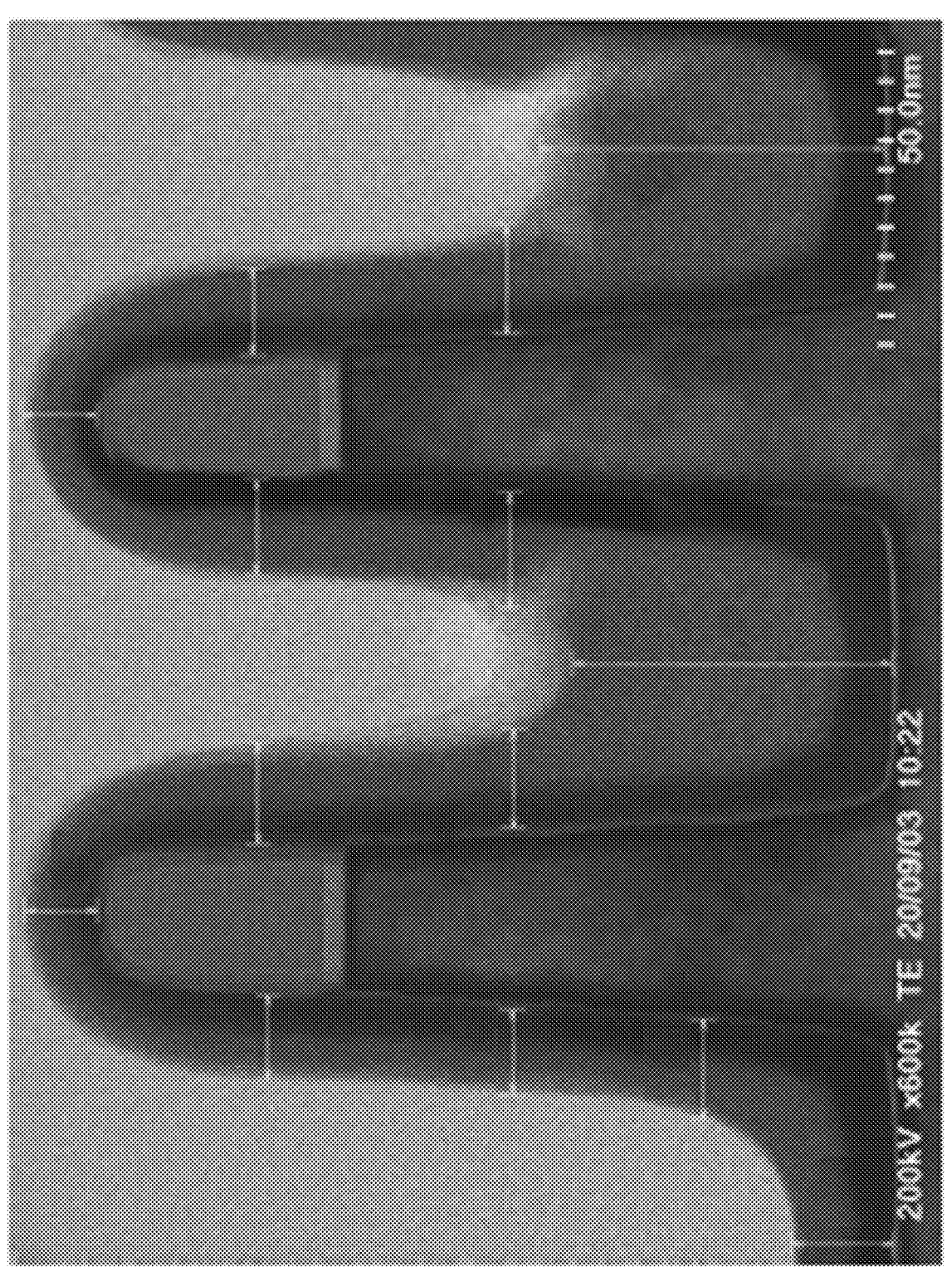
FIG. 9A and FIG. 9B show transmission electron micrographs of deposited vanadium oxide layers.
Figure 9B:
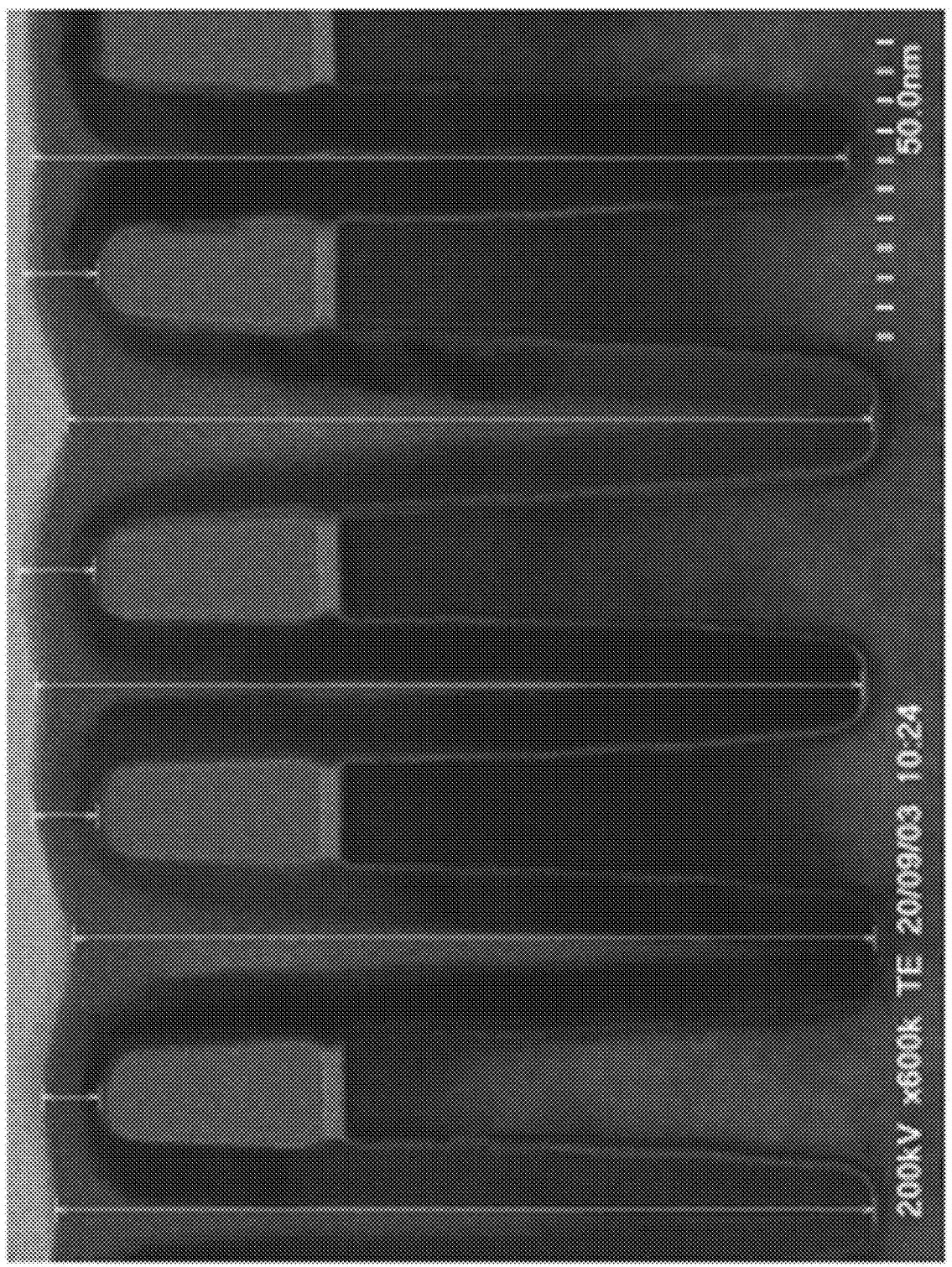

FIG. 9A and FIG. 9B show scanning electron micrographs on high aspect ratio test structures on which a vanadium oxide layer was deposited using an embodiment of a method as disclosed herein. The reaction conditions used were the same as those for the layers of FIG. 7, except that a total of 440 cycles were carried out, for a target thickness of 15 nm was used.

Figure 10:
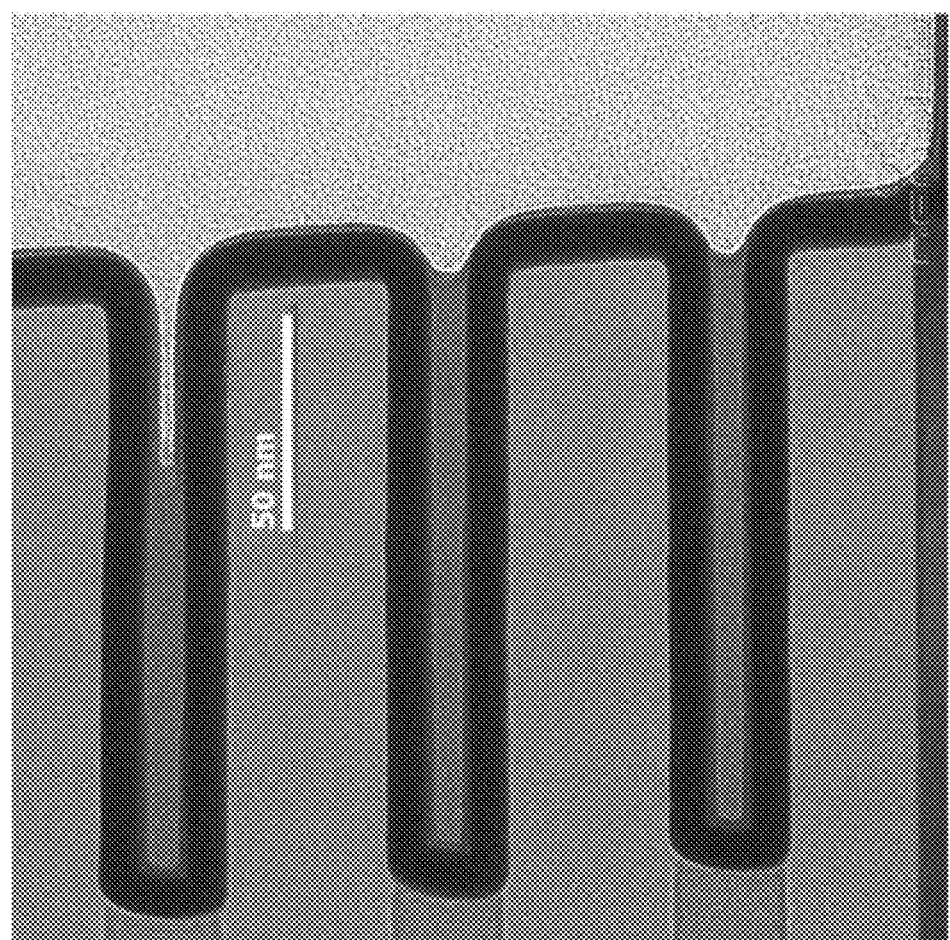
FIG. 10 shows transmission electron micrographs of deposited gap fill vanadium oxide layers.

FIG. 10 shows a scanning electron micrograph of high aspect ratio test structures on which vanadium oxide was deposited using the methods as in FIG. 7.

Figure 11A:
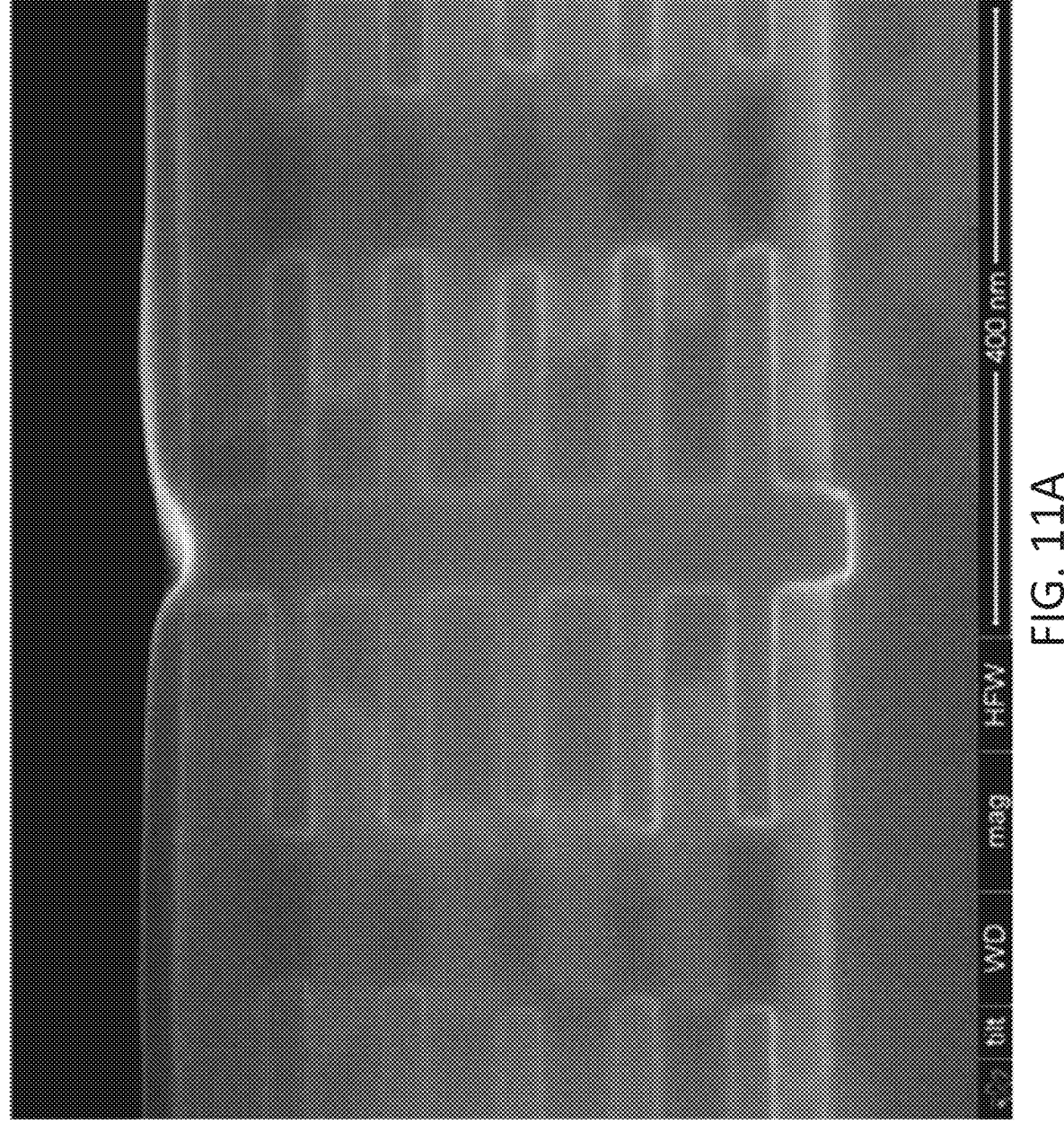
FIG. 11A and FIG. 11B show transmission electron micrographs of gap fill layers deposited at low temperature and low oxygen purge time conditions.
Figure 11B:
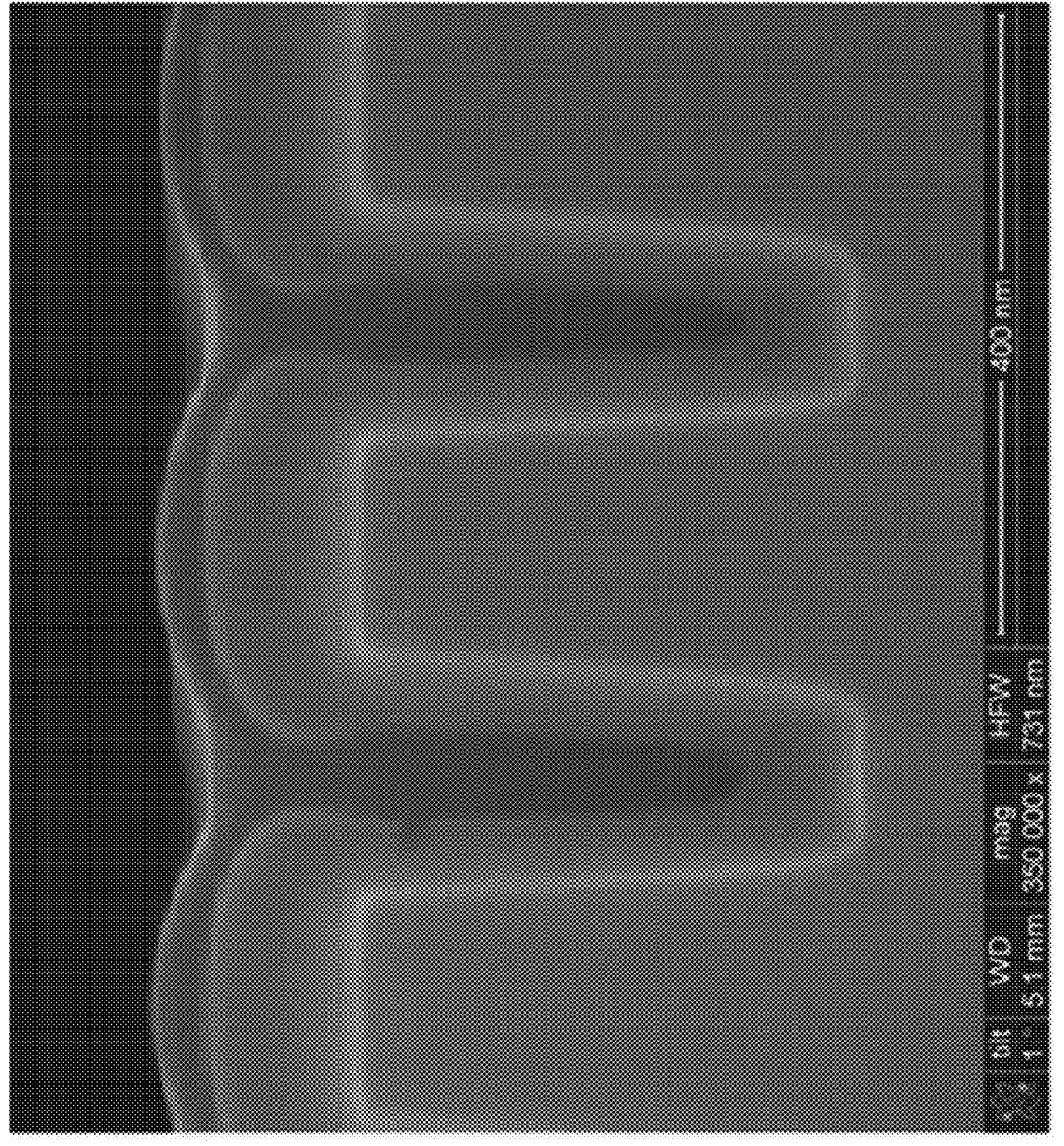

FIGS. 11A and 11B are electron micrographs of improved vanadium oxide layer growth in high aspect ratio structures using a lower substrate temperature and a reduced oxygen reactant purge time. A vanadium oxide gap fill layer was deposited on a silicon substrate with high conformality and low void/seam production. The film was deposited using a susceptor temperature of 115° C. and a reactor chamber pressure of 1 Torr. The oxygen reactant was $H_2O$, and the vanadium precursor used was $VCl_4$. The partial pressure of the $VCl_4$ precursor was 0.3 Torr and the partial pressure of the $H_2O$ reactant was 0.1 Torr. Cycle time for the ALD type deposition was 10.4 s. During the deposition, the vanadium precursor purge time was 5 s, and the oxygen reactant purge time used was 5 s. A growth rate of 0.95 A/cycle was observed, and after 100 cycles had a within-wafer non-uniformity of about 9.7%. FIGS. 11A and 11B illustrate the seamless gap fill structure for high aspect ratio features in which the top entry cavity is <100 nm wide. These structures also show advantageous bottom-up fill.

The embodiments of the disclosure described above are not intended to limit the scope of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A vapor deposition process comprising:
providing a substrate on a susceptor in a reaction space, wherein the substrate comprises a gap comprising a distal part and a proximal part, wherein the substrate comprises a first material, and wherein both the distal part and the proximal part of the gap comprise the first material; and
depositing vanadium oxide on the substrate by a plurality of vapor deposition cycles comprising:

contacting the substrate with a vapor-phase vanadium precursor by pulsing the vapor-phase vanadium precursor into the reaction space for about 0.05 to about 0.2 seconds;
purging excess vapor-phase vanadium precursor from the reaction space; and
contacting the substrate with a vapor-phase oxygen reactant by pulsing the vapor-phase oxygen reactant into the reaction space for about 0.1 to about 0.5 seconds,
wherein the susceptor is maintained at a temperature of between about 50° C. and about 185° C. during the plurality of vapor deposition cycles, and
wherein the vanadium oxide is deposited preferentially in the distal part relative to the proximal part of the gap in the substrate.

2. The vapor deposition process of claim 1, wherein the susceptor is maintained at a temperature of about 115° C. during the plurality of vapor deposition cycles.

3. The vapor deposition process of claim 1, additionally comprising purging excess oxygen reactant from the reaction space for a duration of about 0.1 to about 5 seconds.

4. The vapor deposition process of claim 3, wherein the duration is about 5 seconds.

5. The vapor deposition process of claim 3, wherein purging excess vapor-phase vanadium precursor comprises flowing an inert purge gas into the reaction space.

6. The vapor deposition process of claim 1, wherein the vapor deposition process is an atomic layer deposition process.

7. The vapor deposition process of claim 1, wherein the vapor-phase oxygen reactant comprises one or more of molecular oxygen ($O_2$), water ($H_2O$), and hydrogen peroxide ($H_2O_2$).

8. The vapor deposition process of claim 1, wherein the vapor-phase vanadium precursor comprises one or more of a vanadium halide, a vanadium oxyhalide, a vanadium beta-diketonate compound, a vanadium cyclopentadienyl compound, a vanadium alkoxide compound, a vanadium amidate compound, a vanadium alkylimido compound, and/or a vanadium dialkylamido compound.

9. The vapor deposition process of claim 1, wherein the vapor-phase vanadium precursor is $VCl_4$ and the vapor-phase oxygen reactant is $H_2O$.

10. The vapor deposition process of claim 1, wherein the first material comprises at least one of silicon, silicon germanium, silicon oxide, gallium arsenide, gallium nitride, or silicon carbide.

11. The vapor deposition process of claim 1, wherein the gap on the substrate has an aspect ratio of between 2 and 10.

12. A method of filling a gap on a substrate in a reaction space with vanadium oxide, the method comprising a plurality of vapor deposition cycles, comprising:
alternately and sequentially contacting the substrate with a vapor-phase vanadium precursor and an oxygen reactant, wherein the substrate is supported in the reaction space by a susceptor that is maintained at a temperature of between about 50° C. and about 185° C. during the plurality of vapor deposition cycles, wherein the contacting the substrate with the vapor-phase vanadium precursor comprises pulsing the vapor-phase vanadium precursor into the reaction space for about 0.05 to about 0.2 seconds, and wherein the contacting the substrate with the oxygen reactant comprises pulsing the oxygen reactant into the reaction space for about 0.1 to about 0.5 seconds, wherein the gap comprises a distal part and a proximal part, both of which comprise a first material, and wherein the vanadium oxide is deposited preferentially in the distal part relative to the proximal part.

13. The method of claim 12, wherein the first material comprises at least one of silicon, silicon germanium, silicon oxide, gallium arsenide, gallium nitride, or silicon carbide.

14. The method of claim 12, wherein the gap on the substrate has an aspect ratio of between 2 and 10.

15. The method of claim 12, wherein the gap in the substrate is filled without substantially forming any seams or voids.

16. The method of claim 12, wherein the vapor-phase vanadium precursor is $VCl_4$ and the oxygen reactant is $H_2O$.

17. A method of forming a gap fill layer, comprising:

providing a substrate comprising at least one opening formed thereon, wherein the at least one opening comprises a recessed pattern with an aspect ratio of between 2 and 10, wherein the at least one opening comprises a distal part and a proximal part, wherein the distal part and the proximal part both comprise a first material, wherein the substrate is supported on a susceptor and wherein a temperature of the susceptor is between about 50° C. and about 185° C.; and depositing a material comprising vanadium oxide in the at least one opening by a thermal cyclic vapor deposition process comprising a plurality of vapor deposition cycles, wherein the vapor deposition cycles comprise exposing the substrate to a vanadium precursor comprising $VCl_4$ by pulsing the vanadium precursor into a reaction space for about 0.05 to about 0.2 seconds, exposing the substrate to an oxygen reactant comprising $H_2O$ by pulsing the oxygen reactant into the reaction space for about 0.1 to about 0.5 seconds, and an oxygen reactant purge, and wherein the material comprising vanadium oxide is deposited preferentially in the distal part relative to the proximal part of the at least one opening in the substrate.

18. The method of claim 17, wherein the oxygen reactant purge has a duration of about 1 s to about 5 s.

19. The method of claim 17, wherein the first material comprises at least one of silicon, silicon germanium, silicon oxide, gallium arsenide, gallium nitride, or silicon carbide.

* * * * *